(12) United States Patent
Chen et al.

(10) Patent No.: US 10,788,906 B2
(45) Date of Patent: Sep. 29, 2020

(54) FLEXIBLE PANEL AND MANUFACTURING METHOD THEREOF

(71) Applicants: HannStar Display (Nanjing) Corporation, Nanjing, Jiangsu Province (CN); HANNSTAR DISPLAY CORPORATION, Taipei (TW)

(72) Inventors: Yen-Chung Chen, Taichung (TW); Wei-Chih Hsu, Taichung (TW); Chen-Hao Su, Taichung (TW)

(73) Assignees: HannStar Display (Nanjing) Corporation, Nanjing, Jiangsu Province (CN); HANNSTAR DISPLAY CORPORATION, Taipei (TW)

( * ) Notice: Subject to any disclaimer, the term of this patent is extended or adjusted under 35 U.S.C. 154(b) by 130 days.

(21) Appl. No.: 15/719,579

(22) Filed: Sep. 29, 2017

(65) Prior Publication Data

US 2019/0004642 A1    Jan. 3, 2019

(30) Foreign Application Priority Data

Jun. 29, 2017    (CN) .......................... 2017 1 0518288

(51) Int. Cl.
*G06F 3/041* (2006.01)
*H01L 51/00* (2006.01)
(Continued)

(52) U.S. Cl.
CPC ............ *G06F 3/0412* (2013.01); *G06F 3/044* (2013.01); *H01L 51/003* (2013.01); *G06F 2203/04102* (2013.01); *G06F 2203/04103* (2013.01); *H01L 27/323* (2013.01); *H01L 27/3244* (2013.01); *H01L 51/0097* (2013.01);
(Continued)

(58) Field of Classification Search
None
See application file for complete search history.

(56) References Cited

U.S. PATENT DOCUMENTS 7,820,252 B2 * 10/2010 Higashi ............. G02F 1/133555
349/114
2006/0017707 A1 * 1/2006 Fukui ...................... G06F 3/045
345/173
(Continued)

OTHER PUBLICATIONS

Ozer—optical properties of niobium oxide films—Solar Energy Mat.Solar Cells 40 1996 (Year: 1996).*

*Primary Examiner* — Callie E Shosho
*Assistant Examiner* — John Vincent Lawler
(74) *Attorney, Agent, or Firm* — Winston Hsu

(57) ABSTRACT

A manufacturing method of the flexible panel is provided. Firstly, a carrier substrate is provided. Then, an adhesion layer is formed on the carrier substrate, a flexible substrate is formed on the adhesion layer, and a buffer layer is formed on the flexible substrate. Then, a device layer is formed on the flexible substrate. Next, a separating process is performed for separating the flexible substrate and the device layer from the carrier substrate. According to a relation between a thermal expansion coefficient of the flexible substrate and a thermal expansion coefficient of the carrier substrate, the manufacturing method of the flexible panel selects a pattern of the adhesion layer. The pattern of the adhesion layer includes a frame adhesion structure or a plane adhesion structure.

16 Claims, 20 Drawing Sheets

(51) Int. Cl.
  *G06F 3/044*   (2006.01)
  *H01L 27/32*   (2006.01)
  *H01L 51/52*   (2006.01)

(52) U.S. Cl.
  CPC .... *H01L 51/5237* (2013.01); *H01L 2227/326* (2013.01); *H01L 2251/5338* (2013.01)

(56) References Cited

U.S. PATENT DOCUMENTS

| | | | |
|---|---|---|---|
| 2009/0244028 A1* | 10/2009 | Matsuo | G06F 3/044 345/174 |
| 2011/0318553 A1* | 12/2011 | Lotz | C23C 14/34 428/212 |
| 2013/0213703 A1* | 8/2013 | Kawaguchi | C23C 14/0042 174/257 |
| 2014/0049827 A1* | 2/2014 | Fujii | G02B 1/113 359/586 |
| 2016/0299596 A1* | 10/2016 | den Boer | C03C 17/3671 |

* cited by examiner

Thickness of the first sub-buffer layer (nm)

| | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | 1.24 | 1.27 | 1.29 | 1.31 | 1.31 | 1.30 | 1.28 | 1.25 | 1.20 | 1.14 | 1.06 | 0.98 | 0.89 | 0.79 | 0.68 | 0.58 | 0.49 | 0.40 | 0.33 | 0.27 | 0.23 |
| 5 | 1.22 | 1.29 | 1.36 | 1.42 | 1.48 | 1.53 | 1.56 | 1.58 | 1.58 | 1.55 | 1.51 | 1.45 | 1.36 | 1.26 | 1.14 | 1.00 | 0.86 | 0.71 | 0.56 | 0.42 | 0.29 |
| 10 | 1.37 | 1.49 | 1.61 | 1.73 | 1.84 | 1.94 | 2.02 | 2.09 | 2.12 | 2.12 | 2.09 | 2.03 | 1.93 | 1.80 | 1.64 | 1.45 | 1.24 | 1.01 | 0.78 | 0.54 | 0.32 |
| 15 | 1.67 | 1.84 | 2.02 | 2.19 | 2.36 | 2.51 | 2.64 | 2.73 | 2.78 | 2.79 | 2.75 | 2.67 | 2.53 | 2.35 | 2.13 | 1.87 | 1.57 | 1.26 | 0.93 | 0.60 | 0.28 |
| 20 | 2.09 | 2.33 | 2.56 | 2.79 | 3.00 | 3.19 | 3.34 | 3.44 | 3.49 | 3.49 | 3.42 | 3.29 | 3.10 | 2.85 | 2.55 | 2.20 | 1.82 | 1.41 | 0.99 | 0.58 | 0.18 |
| 25 | 2.61 | 2.90 | 3.18 | 3.45 | 3.70 | 3.90 | 4.06 | 4.15 | 4.18 | 4.13 | 4.01 | 3.82 | 3.55 | 3.22 | 2.83 | 2.40 | 1.93 | 1.44 | 0.94 | 0.44 | -0.02 |
| 30 | 3.16 | 3.50 | 3.82 | 4.12 | 4.38 | 4.58 | 4.71 | 4.78 | 4.75 | 4.65 | 4.46 | 4.19 | 3.84 | 3.42 | 2.95 | 2.43 | 1.87 | 1.30 | 0.74 | 0.19 | -0.32 |
| 35 | 3.71 | 4.07 | 4.42 | 4.72 | 4.97 | 5.15 | 5.24 | 5.25 | 5.17 | 4.99 | 4.72 | 4.36 | 3.92 | 3.42 | 2.86 | 2.26 | 1.64 | 1.01 | 0.39 | -0.19 | -0.72 |
| 40 | 4.18 | 4.57 | 4.91 | 5.20 | 5.42 | 5.55 | 5.58 | 5.52 | 5.36 | 5.10 | 4.74 | 4.30 | 3.78 | 3.20 | 2.56 | 1.90 | 1.22 | 0.55 | -0.10 | -0.69 | -1.22 |
| 45 | 4.56 | 4.94 | 5.26 | 5.51 | 5.67 | 5.74 | 5.70 | 5.56 | 5.31 | 4.96 | 4.52 | 4.00 | 3.40 | 2.75 | 2.06 | 1.34 | 0.63 | -0.06 | -0.71 | -1.30 | -1.79 |
| 50 | 4.79 | 5.14 | 5.42 | 5.61 | 5.71 | 5.70 | 5.58 | 5.35 | 5.01 | 4.58 | 4.06 | 3.46 | 2.80 | 2.09 | 1.36 | 0.61 | -0.11 | -0.80 | -1.43 | -1.98 | -2.42 |
| 55 | 4.85 | 5.16 | 5.38 | 5.50 | 5.51 | 5.41 | 5.20 | 4.89 | 4.47 | 3.96 | 3.36 | 2.70 | 1.99 | 1.25 | 0.50 | -0.25 | -0.97 | -1.63 | -2.22 | -2.70 | -3.07 |
| 60 | 4.75 | 4.99 | 5.13 | 5.16 | 5.09 | 4.90 | 4.60 | 4.20 | 3.71 | 3.13 | 2.48 | 1.77 | 1.03 | 0.28 | -0.48 | -1.21 | -1.89 | -2.51 | -3.03 | -3.43 | -3.70 |
| 65 | 4.47 | 4.63 | 4.68 | 4.63 | 4.46 | 4.18 | 3.80 | 3.33 | 2.77 | 2.14 | 1.45 | 0.72 | -0.03 | -0.78 | -1.51 | -2.20 | -2.83 | -3.37 | -3.81 | -4.11 | -4.27 |
| 70 | 4.05 | 4.11 | 4.07 | 3.92 | 3.67 | 3.31 | 2.85 | 2.32 | 1.71 | 1.04 | 0.34 | -0.39 | -1.13 | -1.85 | -2.53 | -3.16 | -3.71 | -4.16 | -4.50 | -4.69 | -4.74 |
| 75 | 3.50 | 3.47 | 3.33 | 3.09 | 2.75 | 2.32 | 1.81 | 1.23 | 0.60 | -0.08 | -0.78 | -1.49 | -2.19 | -2.85 | -3.47 | -4.01 | -4.47 | -4.81 | -5.03 | -5.12 | -5.05 |
| 80 | 2.88 | 2.75 | 2.52 | 2.20 | 1.79 | 1.31 | 0.76 | 0.15 | -0.49 | -1.15 | -1.83 | -2.49 | -3.12 | -3.71 | -4.23 | -4.68 | -5.02 | -5.25 | -5.36 | -5.33 | -5.15 |
| 85 | 2.22 | 2.00 | 1.69 | 1.31 | 0.85 | 0.33 | -0.24 | -0.84 | -1.46 | -2.08 | -2.70 | -3.29 | -3.84 | -4.33 | -4.75 | -5.08 | -5.31 | -5.42 | -5.42 | -5.28 | -5.02 |
| 90 | 1.59 | 1.29 | 0.92 | 0.49 | 0.00 | -0.53 | -1.08 | -1.65 | -2.22 | -2.78 | -3.32 | -3.81 | -4.26 | -4.64 | -4.94 | -5.15 | -5.27 | -5.28 | -5.17 | -4.96 | -4.63 |
| 95 | 1.03 | 0.68 | 0.27 | -0.19 | -0.67 | -1.18 | -1.69 | -2.20 | -2.70 | -3.17 | -3.61 | -3.99 | -4.32 | -4.58 | -4.76 | -4.86 | -4.88 | -4.79 | -4.62 | -4.35 | -3.98 |
| 100 | 0.61 | 0.22 | -0.20 | -0.65 | -1.10 | -1.56 | -2.01 | -2.43 | -2.83 | -3.19 | -3.51 | -3.78 | -3.98 | -4.13 | -4.20 | -4.21 | -4.13 | -3.99 | -3.77 | -3.48 | -3.12 |

Thickness of the second sub-buffer layer (nm)

Thickness of the first sub-buffer layer (nm)

| Thickness of the second sub-buffer layer (nm) | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | 1.24 | 1.27 | 1.29 | 1.31 | 1.31 | 1.30 | 1.28 | 1.25 | 1.20 | 1.14 | 1.06 | 0.98 | 0.89 | 0.79 | 0.68 | 0.58 | 0.49 | 0.40 | 0.33 | 0.27 | 0.23 |
| 5 | 1.26 | 1.34 | 1.44 | 1.53 | 1.61 | 1.68 | 1.74 | 1.78 | 1.80 | 1.80 | 1.76 | 1.70 | 1.62 | 1.51 | 1.37 | 1.22 | 1.05 | 0.87 | 0.68 | 0.49 | 0.32 |
| 10 | 1.56 | 1.73 | 1.90 | 2.07 | 2.24 | 2.39 | 2.52 | 2.63 | 2.69 | 2.71 | 2.69 | 2.62 | 2.51 | 2.35 | 2.14 | 1.90 | 1.62 | 1.32 | 1.00 | 0.68 | 0.36 |
| 15 | 2.13 | 2.38 | 2.64 | 2.90 | 3.14 | 3.36 | 3.54 | 3.67 | 3.75 | 3.77 | 3.72 | 3.60 | 3.42 | 3.17 | 2.87 | 2.51 | 2.11 | 1.68 | 1.22 | 0.77 | 0.32 |
| 20 | 2.89 | 3.22 | 3.56 | 3.89 | 4.19 | 4.44 | 4.64 | 4.77 | 4.83 | 4.80 | 4.69 | 4.49 | 4.21 | 3.86 | 3.43 | 2.95 | 2.42 | 1.86 | 1.28 | 0.71 | 0.15 |
| 25 | 3.73 | 4.14 | 4.54 | 4.92 | 5.24 | 5.50 | 5.68 | 5.78 | 5.77 | 5.67 | 5.46 | 5.16 | 4.77 | 4.29 | 3.74 | 3.13 | 2.48 | 1.80 | 1.12 | 0.46 | -0.17 |
| 30 | 4.56 | 5.03 | 5.46 | 5.85 | 6.16 | 6.39 | 6.52 | 6.54 | 6.45 | 6.25 | 5.93 | 5.51 | 4.99 | 4.39 | 3.72 | 3.01 | 2.25 | 1.49 | 0.73 | 0.01 | -0.66 |
| 35 | 5.28 | 5.77 | 6.21 | 6.57 | 6.84 | 7.01 | 7.05 | 6.98 | 6.78 | 6.46 | 6.02 | 5.48 | 4.85 | 4.14 | 3.37 | 2.56 | 1.72 | 0.90 | 0.10 | -0.65 | -1.32 |
| 40 | 5.80 | 6.28 | 6.69 | 7.00 | 7.19 | 7.27 | 7.21 | 7.02 | 6.70 | 6.26 | 5.71 | 5.06 | 4.32 | 3.52 | 2.67 | 1.79 | 0.91 | 0.05 | -0.76 | -1.49 | -2.12 |
| 45 | 6.06 | 6.50 | 6.85 | 7.07 | 7.17 | 7.14 | 6.97 | 6.66 | 6.22 | 5.66 | 5.00 | 4.25 | 3.43 | 2.56 | 1.65 | 0.74 | -0.16 | -1.02 | -1.81 | -2.49 | -3.05 |
| 50 | 6.04 | 6.41 | 6.66 | 6.79 | 6.77 | 6.62 | 6.32 | 5.89 | 5.35 | 4.69 | 3.94 | 3.11 | 2.22 | 1.30 | 0.37 | -0.56 | -1.44 | -2.26 | -2.99 | -3.60 | -4.06 |
| 55 | 5.72 | 5.99 | 6.14 | 6.14 | 6.00 | 5.73 | 5.31 | 4.78 | 4.13 | 3.38 | 2.56 | 1.68 | 0.76 | -0.18 | -1.11 | -2.01 | -2.85 | -3.61 | -4.25 | -4.75 | -5.08 |
| 60 | 5.13 | 5.28 | 5.30 | 5.18 | 4.92 | 4.52 | 4.00 | 3.37 | 2.64 | 1.83 | 0.96 | 0.05 | -0.88 | -1.80 | -2.70 | -3.55 | -4.31 | -4.97 | -5.50 | -5.86 | -6.05 |
| 65 | 4.30 | 4.33 | 4.22 | 3.97 | 3.59 | 3.08 | 2.47 | 1.76 | 0.97 | 0.13 | -0.76 | -1.67 | -2.57 | -3.45 | -4.29 | -5.04 | -5.70 | -6.23 | -6.62 | -6.83 | -6.86 |
| 70 | 3.32 | 3.21 | 2.96 | 2.59 | 2.11 | 1.51 | 0.83 | 0.07 | -0.75 | -1.60 | -2.48 | -3.35 | -4.19 | -4.99 | -5.72 | -6.36 | -6.89 | -7.27 | -7.50 | -7.56 | -7.42 |
| 75 | 2.26 | 2.01 | 1.65 | 1.17 | 0.60 | -0.06 | -0.79 | -1.56 | -2.38 | -3.20 | -4.02 | -4.82 | -5.57 | -6.26 | -6.86 | -7.35 | -7.72 | -7.95 | -8.02 | -7.91 | -7.63 |
| 80 | 1.23 | 0.86 | 0.40 | -0.16 | -0.79 | -1.48 | -2.21 | -2.97 | -3.74 | -4.50 | -5.23 | -5.92 | -6.54 | -7.08 | -7.53 | -7.86 | -8.07 | -8.13 | -8.05 | -7.81 | -7.41 |
| 85 | 0.34 | -0.12 | -0.66 | -1.26 | -1.91 | -2.60 | -3.29 | -3.99 | -4.67 | -5.32 | -5.93 | -6.47 | -6.94 | -7.31 | -7.59 | -7.76 | -7.81 | -7.73 | -7.52 | -7.17 | -6.70 |
| 90 | -0.30 | -0.83 | -1.40 | -2.00 | -2.63 | -3.25 | -3.87 | -4.46 | -5.02 | -5.52 | -5.97 | -6.34 | -6.64 | -6.85 | -6.96 | -6.98 | -6.89 | -6.70 | -6.40 | -6.00 | -5.51 |
| 95 | -0.61 | -1.15 | -1.71 | -2.27 | -2.82 | -3.34 | -3.83 | -4.28 | -4.68 | -5.01 | -5.28 | -5.48 | -5.61 | -5.66 | -5.64 | -5.53 | -5.35 | -5.09 | -4.77 | -4.37 | -3.92 |
| 100 | -0.55 | -1.05 | -1.54 | -2.01 | -2.43 | -2.81 | -3.14 | -3.42 | -3.63 | -3.79 | -3.89 | -3.92 | -3.90 | -3.83 | -3.70 | -3.52 | -3.30 | -3.04 | -2.74 | -2.40 | -2.04 |

| Thickness of the second sub-buffer layer (nm) \ Thickness of the first sub-buffer layer (nm) | 0 | 5 | 10 | 15 | 20 | 25 | 30 | 35 | 40 | 45 | 50 | 55 | 60 | 65 | 70 | 75 | 80 | 85 | 90 | 95 | 100 |
|---|---|---|---|---|---|---|---|---|---|---|---|---|---|---|---|---|---|---|---|---|---|
| 0 | 1.24 | 1.27 | 1.29 | 1.31 | 1.31 | 1.30 | 1.28 | 1.25 | 1.20 | 1.14 | 1.06 | 0.98 | 0.89 | 0.79 | 0.68 | 0.58 | 0.49 | 0.40 | 0.33 | 0.27 | 0.23 |
| 5 | 1.31 | 1.42 | 1.54 | 1.66 | 1.77 | 1.88 | 1.96 | 2.03 | 2.07 | 2.08 | 2.06 | 2.00 | 1.91 | 1.79 | 1.64 | 1.46 | 1.26 | 1.04 | 0.81 | 0.58 | 0.35 |
| 10 | 1.85 | 2.07 | 2.30 | 2.53 | 2.76 | 2.96 | 3.14 | 3.28 | 3.37 | 3.41 | 3.39 | 3.31 | 3.17 | 2.97 | 2.71 | 2.40 | 2.05 | 1.67 | 1.26 | 0.84 | 0.43 |
| 15 | 2.77 | 3.11 | 3.45 | 3.79 | 4.11 | 4.39 | 4.62 | 4.79 | 4.88 | 4.89 | 4.81 | 4.65 | 4.40 | 4.07 | 3.67 | 3.20 | 2.68 | 2.12 | 1.54 | 0.95 | 0.38 |
| 20 | 3.91 | 4.36 | 4.80 | 5.22 | 5.59 | 5.90 | 6.13 | 6.27 | 6.30 | 6.23 | 6.05 | 5.76 | 5.37 | 4.89 | 4.32 | 3.69 | 3.01 | 2.29 | 1.56 | 0.83 | 0.14 |
| 25 | 5.08 | 5.61 | 6.12 | 6.57 | 6.95 | 7.23 | 7.41 | 7.47 | 7.40 | 7.20 | 6.88 | 6.44 | 5.90 | 5.26 | 4.54 | 3.76 | 2.93 | 2.09 | 1.24 | 0.42 | -0.34 |
| 30 | 6.11 | 6.68 | 7.20 | 7.64 | 7.97 | 8.18 | 8.26 | 8.19 | 7.99 | 7.65 | 7.18 | 6.59 | 5.89 | 5.11 | 4.26 | 3.35 | 2.42 | 1.49 | 0.57 | -0.29 | -1.07 |
| 35 | 6.84 | 7.41 | 7.90 | 8.27 | 8.51 | 8.61 | 8.56 | 8.36 | 8.00 | 7.51 | 6.90 | 6.17 | 5.34 | 4.44 | 3.48 | 2.48 | 1.48 | 0.50 | -0.44 | -1.30 | -2.05 |
| 40 | 7.19 | 7.71 | 8.12 | 8.39 | 8.51 | 8.47 | 8.27 | 7.92 | 7.42 | 6.79 | 6.04 | 5.19 | 4.25 | 3.26 | 2.23 | 1.19 | 0.15 | -0.83 | -1.75 | -2.56 | -3.24 |
| 45 | 7.10 | 7.53 | 7.83 | 7.97 | 7.95 | 7.76 | 7.41 | 6.91 | 6.28 | 5.52 | 4.66 | 3.71 | 2.70 | 1.65 | 0.58 | -0.48 | -1.50 | -2.45 | -3.31 | -4.03 | -4.60 |
| 50 | 6.56 | 6.88 | 7.04 | 7.03 | 6.85 | 6.52 | 6.03 | 5.40 | 4.64 | 3.78 | 2.83 | 1.82 | 0.76 | -0.31 | -1.38 | -2.42 | -3.39 | -4.27 | -5.03 | -5.63 | -6.04 |
| 55 | 5.63 | 5.79 | 5.80 | 5.63 | 5.30 | 4.82 | 4.20 | 3.46 | 2.60 | 1.67 | 0.66 | -0.39 | -1.45 | -2.52 | -3.55 | -4.52 | -5.41 | -6.18 | -6.80 | -7.24 | -7.47 |
| 60 | 4.36 | 4.36 | 4.20 | 3.88 | 3.41 | 2.80 | 2.06 | 1.23 | 0.31 | -0.68 | -1.71 | -2.75 | -3.79 | -4.80 | -5.76 | -6.63 | -7.39 | -8.00 | -8.45 | -8.71 | -8.74 |
| 65 | 2.87 | 2.70 | 2.38 | 1.91 | 1.31 | 0.59 | -0.23 | -1.12 | -2.08 | -3.07 | -4.08 | -5.08 | -6.05 | -6.96 | -7.79 | -8.52 | -9.11 | -9.55 | -9.80 | -9.86 | -9.69 |
| 70 | 1.33 | 0.99 | 0.52 | -0.08 | -0.78 | -1.58 | -2.45 | -3.36 | -4.31 | -5.26 | -6.20 | -7.11 | -7.96 | -8.73 | -9.40 | -9.94 | -10.3 | -10.6 | -10.6 | -10.5 | -10.1 |
| 75 | -0.09 | -0.58 | -1.17 | -1.87 | -2.64 | -3.46 | -4.33 | -5.21 | -6.09 | -6.96 | -7.78 | -8.54 | -9.22 | -9.80 | -10.3 | -10.6 | -10.8 | -10.8 | -10.7 | -10.3 | -9.85 |
| 80 | -1.18 | -1.78 | -2.46 | -3.20 | -3.98 | -4.78 | -5.59 | -6.38 | -7.13 | -7.84 | -8.49 | -9.06 | -9.53 | -9.90 | -10.2 | -10.3 | -10.3 | -10.1 | -9.80 | -9.35 | -8.77 |
| 85 | -1.76 | -2.43 | -3.13 | -3.85 | -4.57 | -5.28 | -5.96 | -6.59 | -7.17 | -7.68 | -8.11 | -8.45 | -8.70 | -8.85 | -8.89 | -8.83 | -8.65 | -8.36 | -7.97 | -7.47 | -6.88 |
| 90 | -1.72 | -2.37 | -3.02 | -3.65 | -4.25 | -4.79 | -5.28 | -5.71 | -6.06 | -6.34 | -6.53 | -6.65 | -6.69 | -6.64 | -6.52 | -6.32 | -6.05 | -5.71 | -5.31 | -4.85 | -4.34 |
| 95 | -1.02 | -1.58 | -2.10 | -2.57 | -2.97 | -3.30 | -3.56 | -3.74 | -3.85 | -3.90 | -3.87 | -3.80 | -3.66 | -3.48 | -3.26 | -3.01 | -2.73 | -2.42 | -2.10 | -1.76 | -1.41 |
| 100 | 0.28 | -0.12 | -0.45 | -0.70 | -0.86 | -0.94 | -0.95 | -0.90 | -0.78 | -0.63 | -0.44 | -0.22 | 0.01 | 0.24 | 0.48 | 0.70 | 0.91 | 1.10 | 1.27 | 1.42 | 1.55 |

FIG. 10C

FLEXIBLE PANEL AND MANUFACTURING METHOD THEREOF

BACKGROUND OF THE INVENTION

1. Field of the Invention

The present invention relates to a flexible panel and a manufacturing method of a flexible panel, and more particularly to a flexible panel and a manufacturing method of a flexible panel for adjusting the color and improving problems of lifting up or cracking a flexible substrate.

2. Description of the Prior Art

In display technology, a flexible panel has advantageous characteristics of high lightness, impact resistance, flexibility, wearable property and easy portability, and therefore, the flexible panel has become a new generation of the forward display technology now.

Because a rigidity of a flexible substrate is insufficient, a traditional manufacturing method of the flexible panel utilizes an adhesion layer for adhering the flexible substrate and a carrier substrate having greater rigidity through a suitable adhesive force, and then, after the electronic devices are formed on the flexible substrate, the flexible panel and the carrier substrate are separated by a separating process. However, since a thermal expansion coefficient of the flexible substrate is not equal to thermal expansion coefficients of the carrier substrate and the conductive material which are in contact with the flexible substrate, such as a difference is greater than or equal to 10 ppm/° C., the thermal expansion and contraction of films would be influenced by each other according to temperature changing. Thus, in the manufacturing process, mismatch between the thermal expansion coefficients of the materials would result in that the flexible substrate is cracked or be lifted up under changing temperature, such that the production yield rate would be decreased. Therefore, the industry needs to provide a better and more reliable manufacturing method.

SUMMARY OF THE INVENTION

The technical problem wanting to be solved by the present invention is providing a manufacturing method of a flexible panel of which manufacturing processes would be selected according to a relation of thermal expansion coefficients of a flexible substrate, a carrier substrate and a conductive layer and/or an insulation layer which are closest to the flexible substrate, so as to improve problems of lifting up or cracking a flexible substrate. Furthermore, the present invention provides a flexible panel which is manufactured by the manufacturing method of the present invention described above and is adjusted color through thickness of films.

In order to achieve the objectives described above, the present invention provides a flexible panel including a flexible substrate, a buffer layer and a device layer. The buffer layer is disposed on the flexible substrate, wherein the buffer layer comprises a first sub-buffer layer and a second sub-buffer layer, and a refraction index of the second sub-buffer layer is different from a refraction index of the first sub-buffer layer. The device layer is disposed on the buffer layer.

Further, in order to achieve the objectives described above, the present invention provides a manufacturing method of a flexible panel. Firstly, a carrier substrate is provided. Then, an adhesion layer is formed on the carrier substrate, a flexible substrate is formed on the adhesion layer, and a buffer layer is formed on the flexible substrate. The buffer layer includes a first sub-buffer layer and a second sub-buffer layer, and a refraction index of the second sub-buffer layer is different from a refraction index of the first sub-buffer layer. Then, a device layer is formed on the flexible substrate. Next, a separating process is performed for separating the flexible substrate and the device layer from the carrier substrate.

The manufacturing method of the flexible panel of the present invention correspondingly selects the suitable manufacturing processes according to the relation of the thermal expansion coefficient of the carrier substrate, the thermal expansion coefficient of the flexible substrate and the thermal expansion coefficient of the conductive layer and/or the insulation layer of the device layer closest to the flexible substrate, so as to utilize the pattern of the adhesion layer and the disposition of the buffer layer for preventing the flexible substrate from being cracked or lifted up. Therefore, the yield rate can be increased and the manufacturing cost can be saved. On the other hand, in the correspondingly manufacturing flexible panel, the flexible panel having the buffer layer can utilize the buffer layer for serving as the index matching layer of the flexible panel, so as to adjust the color of the flexible panel, and the flexible panel which does not have the buffer layer can utilize changing the thickness of the patterned conductive layer for adjusting the color of the flexible panel, thereby improving the quality of display.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 10A to FIG. 10C are schematic diagrams of a relation between a thickness of the buffer layer and b* of the flexible panel according to the variant embodiment of the first embodiment of the present invention.

DETAILED DESCRIPTION

Figure 1:
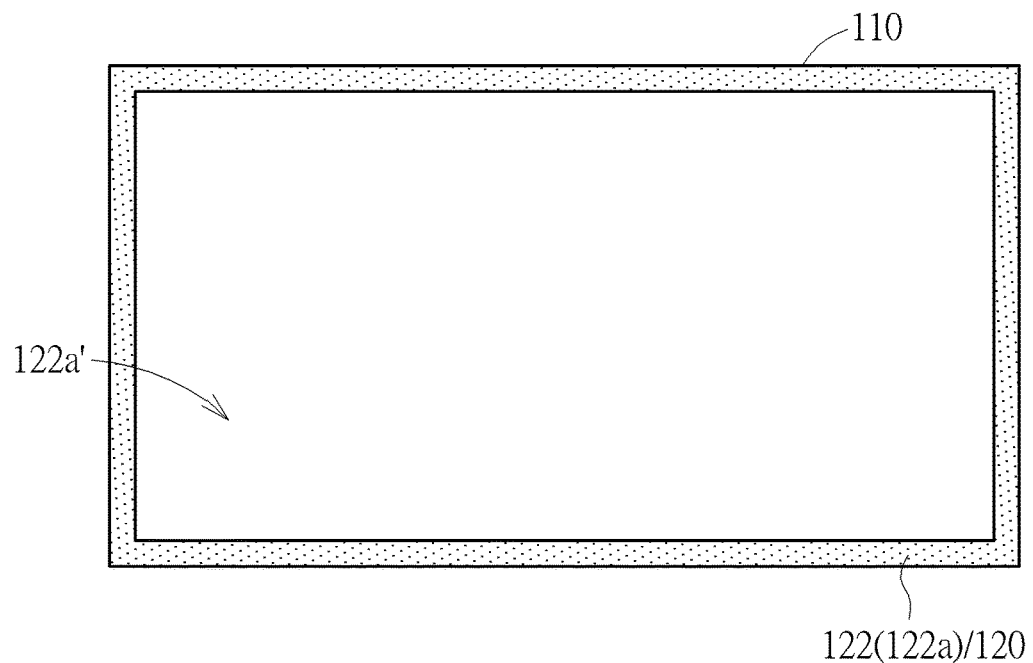
FIG. 1 is a schematic diagram of a top view of a manufacturing method of a flexible panel according to a first embodiment of the present invention.

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved. It is needed to note that the drawings are simplified schematic, and therefore, the drawings show only the components and combinations associated with the present invention, so as to provide a clearer description of the basic architecture or method of implementation of the present invention. The components would be complex in reality. In addition, in order to explain, the components shown in the drawings of the present invention are not drawn to the actual number, shape, and dimensions, the detail can be adjusted according to the design requirements.

Figure 2:
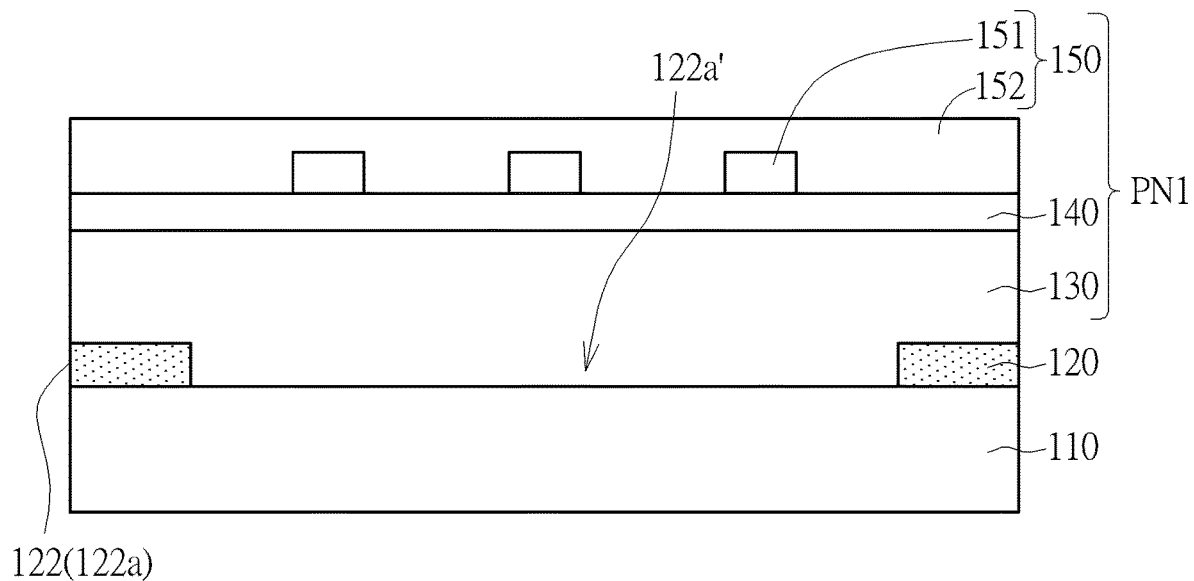
FIG. 2 and FIG. 3 are schematic diagrams of a cross-sectional view of the manufacturing method of the flexible panel according to the first embodiment of the present invention.
Figure 3:
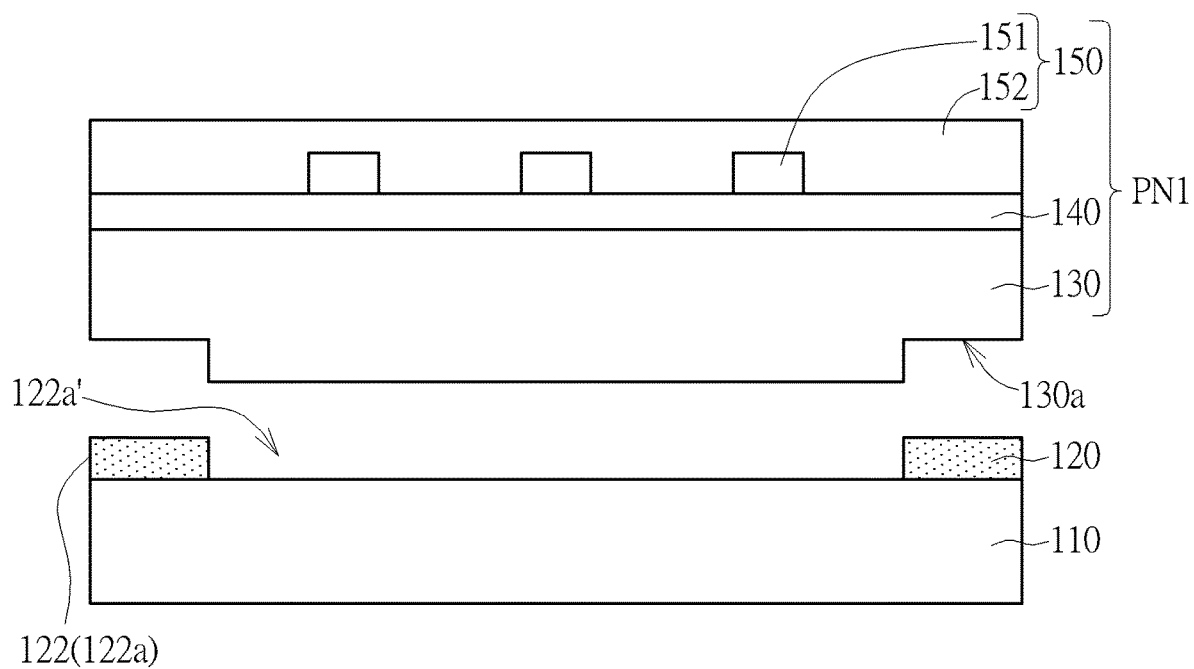
Figure 4A:
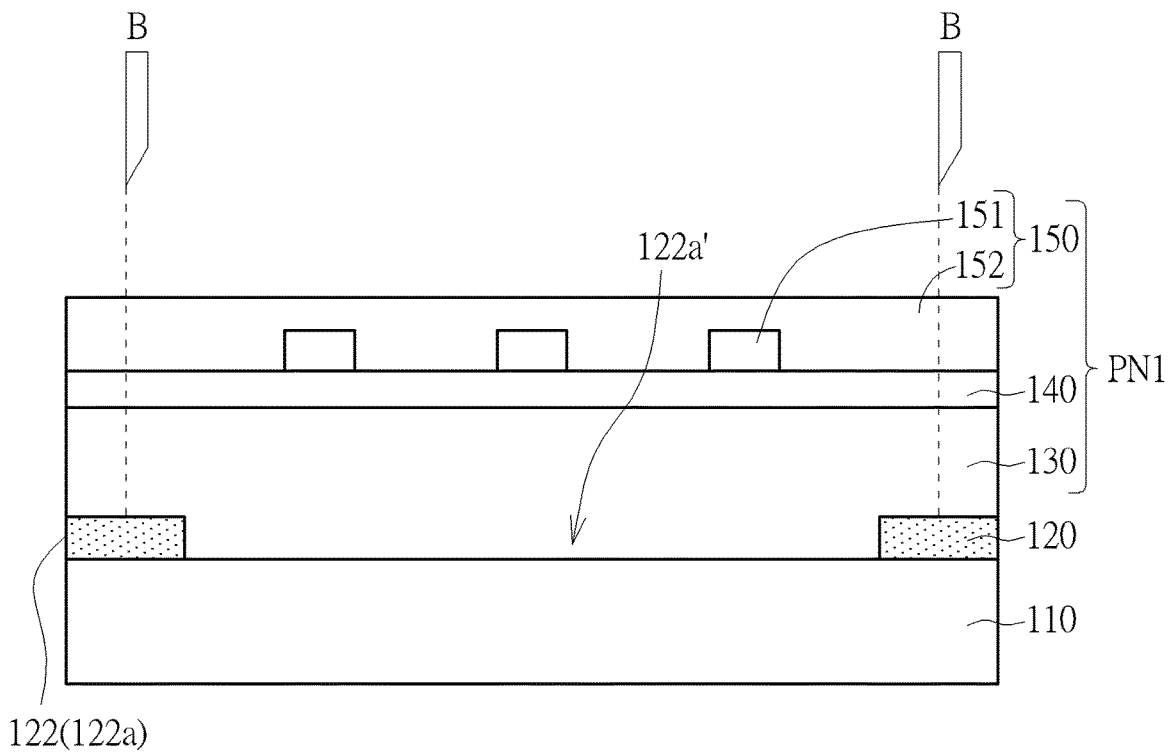
FIG. 4A and FIG. 4B are schematic diagrams of a cross-sectional view of a cutting process and the carrier-substrate separating process according to an embodiment of the present invention.
Figure 4B:
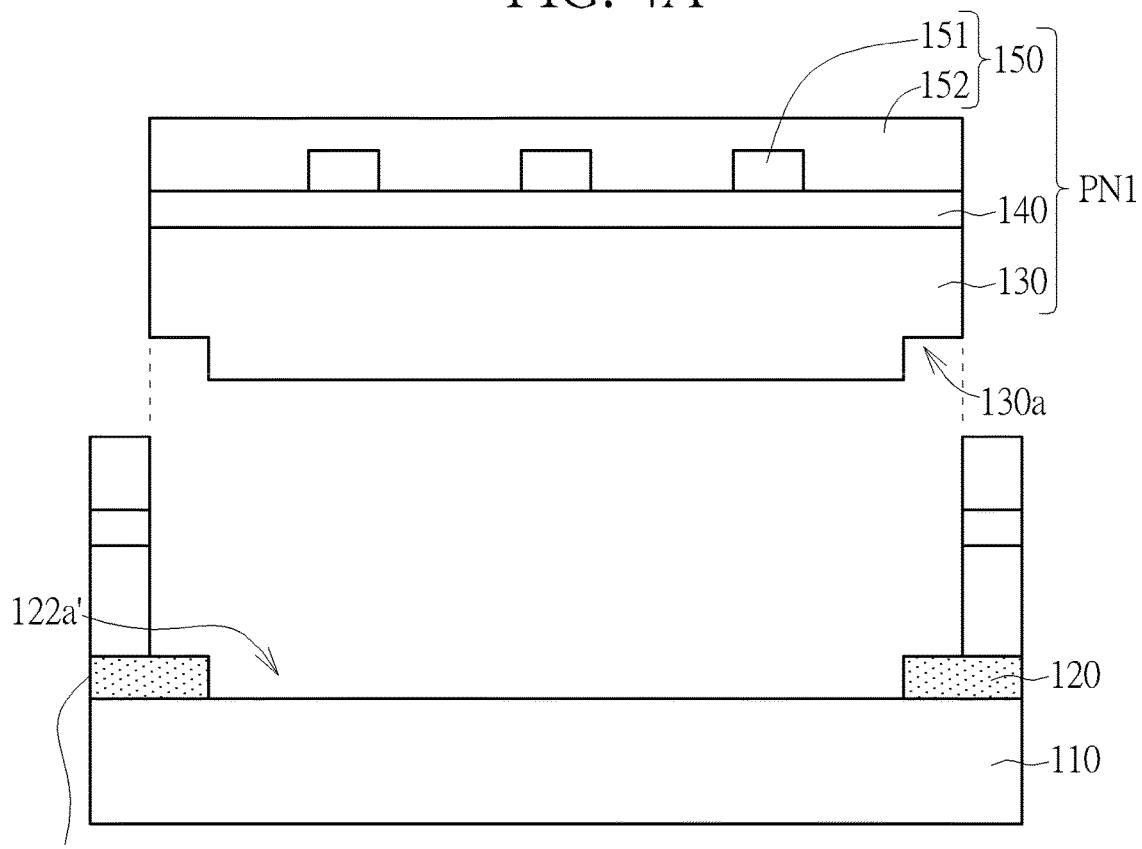

Referring to FIG. 1 to FIG. 3, FIG. 1 is a schematic diagram of a top view of a manufacturing method of a flexible panel according to a first embodiment of the present invention, and FIG. 2 and FIG. 3 are schematic diagrams of a cross-sectional view of the manufacturing method of the flexible panel according to the first embodiment of the present invention, wherein FIG. 1 shows the carrier substrate 110 and the adhesion layer 120 only. The manufacturing method of the flexible panel of this embodiment may be suitable for using in following conditions: (1) no matter what a difference between the thermal expansion coefficient of the flexible substrate 130 and the thermal expansion coefficient of the conductive layer and/or the insulation layer of a device layer 150 closest to the flexible substrate 130 is, and a difference between a thermal expansion coefficient of the flexible substrate 130 and a thermal expansion coefficient of the carrier substrate 110 is greater than or equal to 10 ppm/° C.; or (2) the difference between the thermal expansion coefficient of the flexible substrate 130 and the thermal expansion coefficient of the carrier substrate 110 is smaller than 10 ppm/° C., and the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C. As shown in FIG. 1, according to the manufacturing method of the flexible panel of the first embodiment of the present invention, firstly, a carrier substrate 110 is provided, and the carrier substrate 110 may be such as a rigid carrier substrate including glass, plastic or quartz having high rigidity. Then, an adhesion layer 120 is formed on the carrier substrate 110, wherein the adhesion layer 120 includes such as 3-(2-aminoethylamino)propyltrimethoxysilane, but not limited thereto. The adhesion layer 120 may be manufactured by a photolithography process, a screen printing process, a coating process or other suitable patterned processes. In this embodiment, the adhesion layer 120 is formed to include a frame adhesion structure 122a, and the frame adhesion structure 122a includes an opening 122a'. In this embodiment, the frame adhesion structure 122a may be formed of a plurality of first strip adhesion structures 122, and a width of the first strip adhesion structure 122 may be smaller than or equal to 2 centimeters (cm), so as to achieve a good layout design and a great adhesion, but not limited thereto. In this embodiment, a shape of the frame adhesion structure 122a and a shape of the opening 122a' are rectangular, but not limited thereto. Moreover, in this embodiment, edges of the frame adhesion structure 122a overlap edges of the carrier substrate 110, but not limited thereto. In another embodiment, a distance exists between the edge of the frame adhesion structure 122a and the edge of the carrier substrate 110.

Then, as shown in FIG. 2, the flexible substrate 130 is formed on the adhesion layer 120, wherein the flexible substrate 130 is flexible or foldable, and material of the flexible substrate 130 may include polyimide (PI), polyethylene terephthalate (PET), cyclic olefin polymer (COP), polycarbonate (PC), polymethyl methacrylate (PMMA), cyclic olefin copolymer (COC), triacetyl cellulose (TAC), polypropylene (PP), poly styrene (PS), glass or a combination thereof, but not limited thereto. The flexible substrate 130 may be a flexible transparent thin film having low phase difference. In this embodiment, the material of the adhesion layer 120 which makes an adhesive force between the flexible substrate 130 and the adhesion layer 120 be greater than an adhesive force between the flexible substrate 130 and the carrier substrate 110 may be chosen. Therefore, as shown in FIG. 2, because the flexible substrate 130 is in contact with the adhesion layer 120 directly, the flexible substrate 130 may be adhered to and fixed on the carrier substrate 110 by the adhesive force provided from the adhesion layer 120, so as to facilitate the subsequent manufacturing process. Most part of the flexible substrate 130 may be in contact with the carrier substrate 110 through the opening 122a' of the frame adhesion structure 122a of the adhesion layer 120, and the frame adhesion structure 122a of the adhesion layer 120 with a ring pattern or a frame pattern is substantially disposed at a periphery of the flexible substrate 130. Next, a buffer layer 140 is formed on the flexible substrate 130. The buffer layer 140 is blanketly formed on the flexible substrate 130 and completely covers the total upper surface of the flexible substrate 130, that is to say, an area of the flexible substrate 130 is equal to an area of the buffer layer 140, but not limited thereto. In another embodiment, the area of the buffer layer 140 may be smaller than the area of the flexible substrate 130, and a distance exists between the edges of the buffer layer 140 and the edges of the flexible substrate 130. The buffer layer 140 may have a single-layer structure or a multi-layer structure, and the buffer layer 140 may include silicon oxide, silicon nitride, niobium oxide, alumina, organic material or a combination or a stack thereof, but not limited thereto. Then, the device layer 150 is formed on the buffer layer 140, that is to say, the buffer layer 140 is situated between the flexible substrate 130 and the device layer 150, and the flexible substrate 130 is not in contact with the device layer 150 directly. The device layer 150 includes at least one conductive layer and at least one insulation layer. For example, the device layer 150 may include a touch electrode, a thin film transistor, a pixel electrode, a common electrode, a light-emitting diode (such as organic light emitting diode or inorganic light emitting diode), a conductive line, an insulation layer or a combination or a stack thereof. As shown in FIG. 2, the device layer 150 includes a patterned conductive layer 151 and a protective layer 152. For example, in an embodiment of which the flexible panel is a flexible touch panel, the patterned conductive layer 151 may be the touch electrodes or the conductive lines, and the protective layer 152 may be an over-coating layer (OC layer), but not limited thereto. Note that FIG. 2 shows the conductive layer (the patterned conductive layer 151 in FIG. 2) and the insulation layer (the protective layer 152 in FIG. 2) of the device layer 150 closest to the flexible substrate 130 rather than showing every film forming the device layer 150, so as to simply FIG. 2. Material of the patterned conductive layer 151 may include transparent conductive material and/or metal material, but not limited thereto. For example, the material of the patterned conductive layer 151 may include indium tin oxide (ITO), indium zinc oxide (IZO), silver, copper, metal composite material or a combination thereof. The protective layer 152 is disposed on the patterned conductive layer 151, wherein the protective layer 152 may have a single-layer structure or a multi-layer structure, so as to encapsulate and protect the patterned conductive layer 151, and form at least one flexible panel PN1. The flexible panel PN1 includes the flexible substrate 130, the buffer layer 140 and the device layer 150. Note that the cross-sectional view diagram of FIG. 2 shows that the flexible substrate 130, the buffer layer 140, the patterned conductive layer 151 and the protective layer 152 are formed on the adhesion layer 120 in FIG. 1. Further, in an embodiment of which the buffer layer 140 is situated between the flexible substrate 130 and the device layer 150, the conductive layer and/or the insulation layer of the device layer 150 closest to the flexible substrate 130 is referred to as the conductive layer and/or the insulation layer in contact with the buffer layer 140; in another embodiment of which the buffer layer 140 is not situated between the flexible substrate 130 and the device layer 150, the conductive layer and/or the insulation layer of the device layer 150 closest to the flexible substrate 130 is referred to as the conductive layer and/or the insulation layer in contact with the flexible substrate 130. In other words, the conductive layer and/or the insulation layer of the device layer 150 closest to the flexible substrate 130 is referred to as the conductive layer and/or the insulation layer of which at least a portion is situated at the bottom of the device layer 150. Note that the term "conductive layer and/or the insulation layer" means at least one of the conductive layer and the insulation layer. The flexible panel PN1 may be a flexible touch panel, a flexible display panel (such as a liquid crystal display panel, an active-matrix organic light-emitting diode display panel or an electrophoretic display panel) or a flexible touch display panel, but not limited thereto. In this embodiment, the flexible panel PN1 is the touch panel for example, so the patterned conductive layer 151 may include the conductive lines and the flexible touch electrodes, but not limited thereto. In addition, in an embodiment of which the flexible panel PN1 is the flexible display panel (such as the liquid crystal display panel, the active-matrix organic light-emitting diode display panel), the patterned conductive layer 151 may include a plurality of data lines or a plurality of scan lines, but not limited thereto.

Next, a separating process is performed. The flexible panel PN1 is separated from the carrier substrate 110, so as to complete the manufacture of the flexible panel PN1. In the embodiment shown in FIG. 3, a process step to reduce the adhesive force between the adhesion layer 120 and the flexible substrate 130 may be optionally performed before performing the separating process, and then, the flexible substrate 130 is separated from the carrier substrate 110 or the adhesion layer 120. The method of decreasing the adhesive force between the adhesion layer 120 and the flexible substrate 130 may be performed by light illumination or heating, but not limited thereto. Moreover, the method of separating the flexible panel PN1 and the carrier substrate 110 may be that one end of the flexible panel PN1 is clamped by a clamping fixture and the flexible panel PN1 is separated from the carrier substrate 110 with suitable angle and velocity, so as to increase a success rate of separation, but the method of separating is not limited thereto. In addition, before performing the separating process, a cutting process maybe performed selectively. The cutting process cuts the flexible substrate 130, the buffer layer 140 and the device layer 150 along edges of the flexible panel PN1, wherein the cutting process may be performed by laser cutting, mechanical cutting, punching or other suitable methods. For example, in another embodiment shown in FIG. 4A and FIG. 4B, before the separating process is performed, the flexible panel PN1 may be cut along a cutting line B, then, the adhesive force between the adhesion layer 120 and the flexible substrate 130 may be decreased, and next, the flexible substrate 130 would be separated from the carrier substrate 110/the adhesion layer 120. Further, in still another embodiment shown in FIG. 5A and FIG. 5B, before the separating process is performed, the flexible panel PN1 maybe cut along a cutting line C, and then, the flexible substrate 130 would be separated from the carrier substrate 110. As shown in FIG. 3 to FIG. 5B, the flexible substrates 130 of the embodiment shown in FIG. 3 and FIG. 4B have a stair-type side 130a, and the flexible substrate 130 of the embodiment shown in FIG. 5B has a smooth bottom surface and a smooth side. Note that only one flexible panel PN1 is formed on the carrier substrate 110 for example in above paragraphs for simplifying description. In an embodiment of which a plurality of the flexible panels PN1 are formed on the carrier substrate 110, the difference is that a step that the flexible substrate 130, the buffer layer 140 and the device layer 150 are cut to form a plurality of flexible panels PN1 needs to be performed after performing the separating process, wherein the separating process and the steps before performing the separating process are the same as above, and will not be redundantly described. Moreover, in another embodiment of which a plurality of the flexible panels PN1 are formed on the carrier substrate 110, the step of cutting process for forming plural of flexible panels PN1 may be performed before the separating process is performed. That is to say, the cutting process would cut and form the plural flexible panels PN1 on the carrier substrate 110, and then, the plural flexible panels PN1 would be separated from the carrier substrate 110.

Generally, when the device layer 150 is formed on the flexible substrate 130, process temperature is typically as high as 200° C. to 450° C. Therefore, if the difference between the thermal expansion coefficients of the materials of two adjacent layers is greater, it is easy to cause at least one of the two adjacent layers to be cracked or lifted up at the high temperature or when being cooled from the high temperature to a room temperature. For example, if the flexible substrate 130 is in contact with the carrier substrate 110 directly and the difference between the thermal expansion coefficients thereof is greater than or equal to 10 ppm/° C., it is easy to cause the flexible substrate 130 to be cracked or lifted up due to the difference between the thermal expansion coefficients of the flexible substrate 130 and the carrier substrate 110 when performing the manufacturing process of the device layer 150. In addition, if the flexible substrate 130 is in contact with the conductive layer and/or the insulation layer of the device layer 150 and the difference between the thermal expansion coefficients thereof is greater than or equal to 10 ppm/° C., it is easy to cause the flexible substrate 130 to be cracked or be lifted up when performing the manufacturing process of the device layer 150, due to the difference between the thermal expansion coefficients of the conductive layer and/or the insulation layer of the device layer 150 and the adjacent flexible substrate 130.

In order to solve the aforementioned problem, according to this embodiment, if the difference between the thermal expansion coefficient of the flexible substrate 130 and the thermal expansion coefficient of the carrier substrate 110 is greater than or equal to 10 ppm/° C., although most of the flexible substrate 130 is in contact with the carrier substrate 110 through the opening 122a' of the frame adhesion structure 122a of the adhesion layer 120, the buffer layer 140 is formed on the total surface of the flexible substrate 130. Thus, when the temperature is changed in the manufacturing process, although a phenomenon of building up internal stress in flexible substrate 130 would be caused due to the mismatch or greater difference between the thermal expansion coefficient of the flexible substrate 130 and the thermal expansion coefficient of the carrier substrate 110, since the buffer layer 140 is formed on the total surface of the flexible substrate 130 and covers the flexible substrate 130 totally, the internal stress would not be released in the manufacturing process, such that the flexible substrate 130 would not be cracked or be lifted up, so as to increase the yield rate of the flexible panel PN1. On the other hand, no matter what the difference between the thermal expansion coefficient of the flexible substrate 130 and the device layer 150 is, because the flexible substrate 130 is not in contact with the device layer 150 directly, the thermal expansion of the device layer 150 and the thermal expansion of the flexible substrate 130 do not directly influence each other, so as to reduce the stress in the flexible substrate 130, and prevent the flexible substrate 130 from being cracked or lifted up. That is to say, if the difference between the thermal expansion coefficient of the flexible substrate 130 and the thermal expansion coefficient of the conductive layer and/or the insulation layer of the device layer 150 closest to the flexible substrate 130 (such as the patterned conductive layer 151 and the protective layer 152 shown in FIG. 2) is also greater than or equal to 10 ppm/° C., cracking or lifting up caused by the difference between the thermal expansion coefficient of the flexible substrate 130 and the thermal expansion coefficient of the conductive layer and/or the insulation layer of the device layer 150 closest to the flexible substrate 130 can be prevented by forming the buffer layer 140 on the total surface of the flexible substrate 130. On the other hand, if the difference between the thermal expansion coefficient of the flexible substrate 130 and the thermal expansion coefficient of the carrier substrate 110 is smaller than 10 ppm/° C., and the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C., the buffer layer 140 is formed on the flexible substrate 130 before forming the device layer 150, such that the buffer layer 140 is situated between the flexible substrate 130 and the device layer 150, such that the flexible substrate 130 is not in contact with the device layer 150. Thus, cracking or lifting up caused by the difference between the thermal expansion coefficient of the flexible substrate 130 and the thermal expansion coefficient of the conductive layer and/or the insulation layer of the device layer 150 closest to the flexible substrate 130 can be prevented. In other words, if the buffer layer 140 is not disposed on the flexible substrate 130, the conductive layer and/or the insulation layer situated at the bottom of the device layer 150 would be in contact with the flexible substrate 130 when forming the device layer 150. Therefore, if the difference between the thermal expansion coefficient of the conductive layer and/or the insulation layer situated at the bottom of the device layer 150 and the thermal expansion coefficient of the flexible substrate 130 is greater than or equal to 10 ppm/° C., when performing the manufacturing process of the device layer 150, it is easy to cause the flexible substrate 130 to be cracked or lifted up due to the difference between the thermal expansion coefficient of the conductive layer and/or the insulation layer of the device layer 150 and the thermal expansion coefficient of the flexible substrate 130.

Figure 5A:
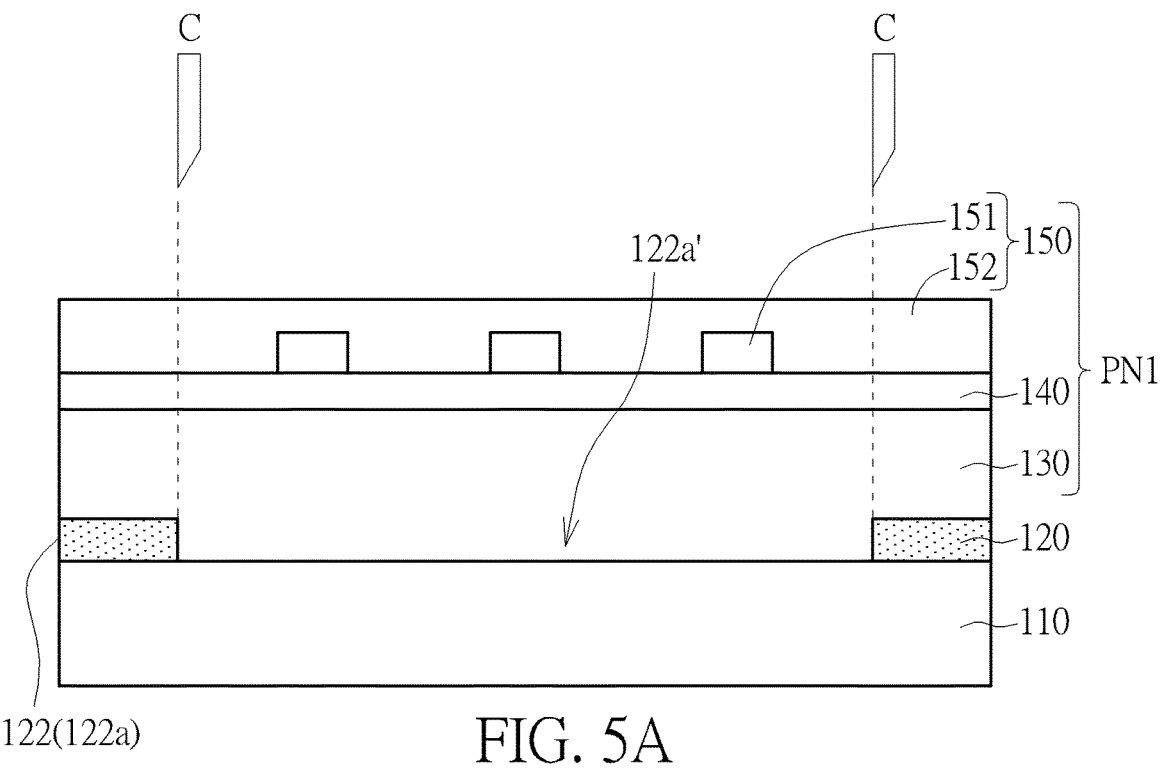
FIG. 5A and FIG. 5B are schematic diagrams of a cross-sectional view of a cutting process and the carrier-substrate separating process according to another embodiment of the present invention.
Figure 5B:
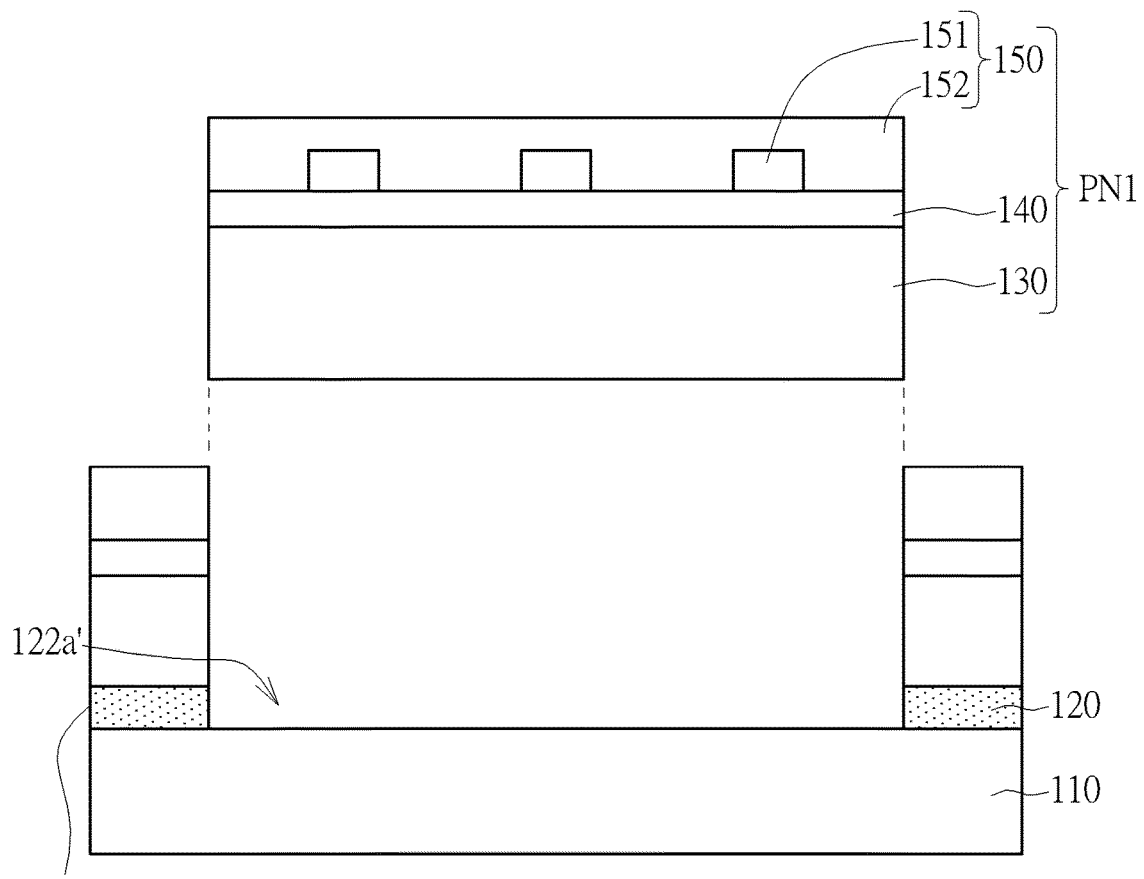
Figure 6:
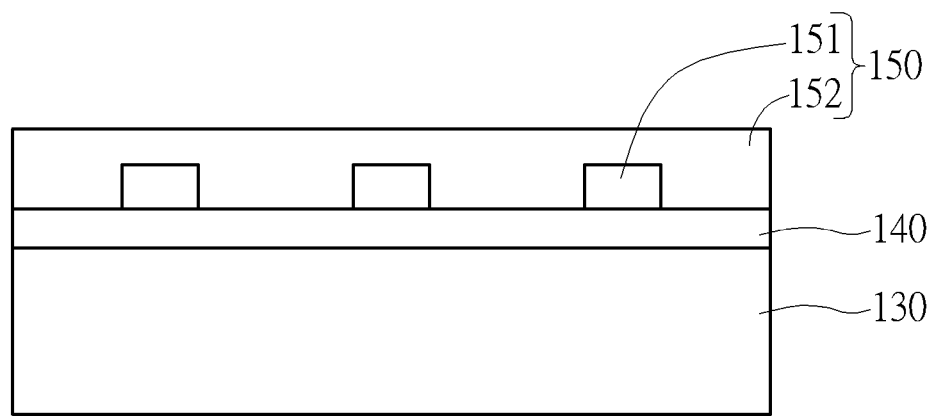
FIG. 6 is a schematic diagram of a cross-sectional view of the flexible panel according to the first embodiment of the present invention.

Referring to FIG. 6, FIG. 6 is a schematic diagram of a cross-sectional view of the flexible panel according to the first embodiment of the present invention, wherein FIG. 6 shows the flexible panel that is separated from the carrier substrate 110 by the separating process shown in FIG. 5B. As shown in FIG. 6, the flexible panel PN1 of this embodiment includes the flexible substrate 130, the buffer layer 140 and the device layer 150, wherein the flexible panel PN1 is manufactured by the manufacturing method of the flexible panel according to the first embodiment of the present embodiment. The material of the flexible substrate 130 of this embodiment includes polyimide for example, but not limited thereto. The buffer layer 140 is disposed on the flexible substrate 130, wherein the material of the buffer layer 140 includes silicon oxide, silicon nitride, niobium oxide, alumina, organic material or a combination or a stack thereof. In this embodiment, the buffer layer 140 has a single-layer structure, and the material of the buffer layer 140 is silicon oxide for example, but not limited thereto. The patterned conductive layer 151 is disposed on the buffer layer 140, wherein the material of the patterned conductive layer 151 may include transparent conductive material and/or metal material. In this embodiment, the material of the patterned conductive layer 151 includes indium tin oxide (ITO) for example, but not limited thereto. The protective layer 152 is disposed on the patterned conductive layer 151, wherein the protective layer 152 may has a single-layer structure or a multi-layer structure, so as to encapsulate and protect the patterned conductive layer 151.

Figure 7A:
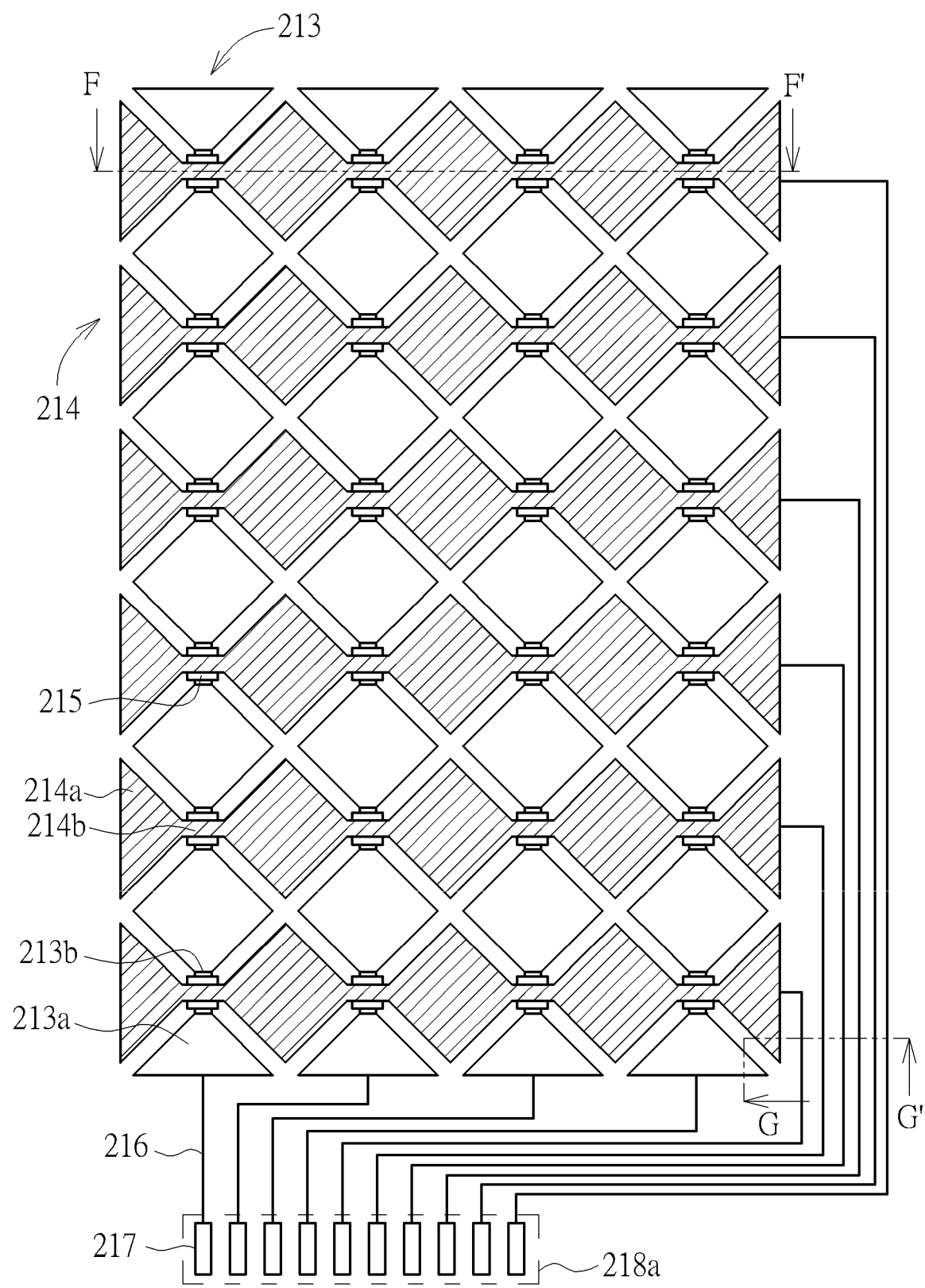
FIG. 7A is a schematic diagram of a top view of a flexible panel according to an embodiment of the present invention.
Figure 7B:
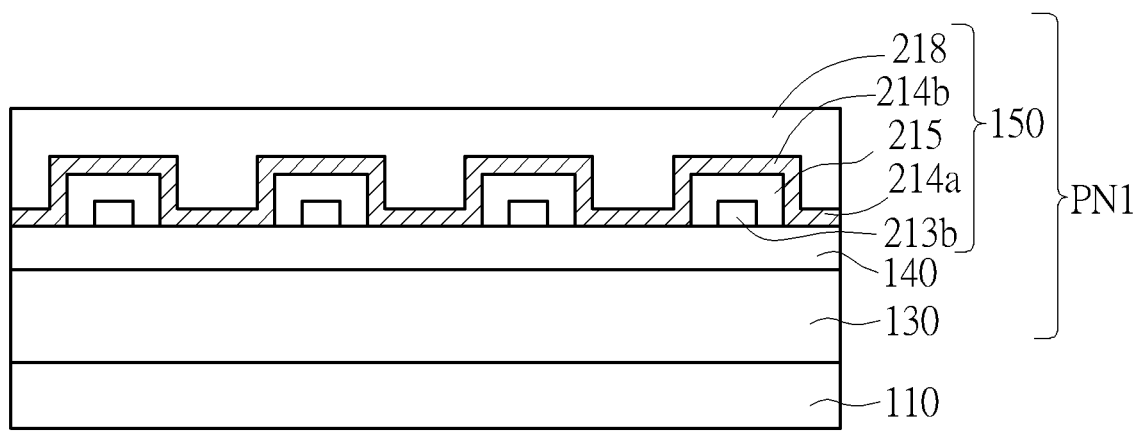
FIG. 7B and FIG. 7C are schematic diagrams of a cross-sectional view respectively taken along the cross-sectional line F-F' and G-G' in FIG. 7A.
Figure 7C:
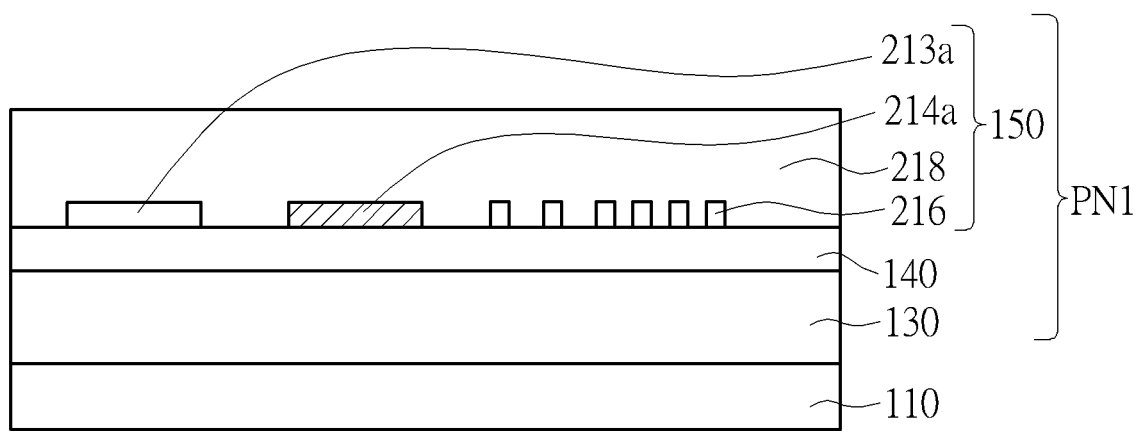

Referring to FIG. 7A to FIG. 7C, for example, when the flexible panel PN1 is a flexible touch panel, the schematic diagrams of the top view and the cross-sectional view of the flexible panel PN1 may be shown in FIG. 7A to FIG. 7C, wherein FIG. 7B and FIG. 7C are the cross-sectional diagrams corresponding to the cross-sectional line F-F' and G-G' in FIG. 7A respectively. The flexible panel PN1 includes a plurality of first touch electrodes 213a and a plurality of second touch electrodes 214a. The adjacent first touch electrodes 213a are electrically connected to each other through first bridge lines 213b, the adjacent second touch electrodes 214a are electrically connected to each other through the second bridge lines 214b, and the first bridge lines 213b are electrically isolated to the second bridge lines 214b by the insulation blocks 215 situated between the first bridge lines 213b and second bridge lines 214b The first touch electrodes 213a and the first bridge lines 213b form a plurality of touch electrode columns 213, the second touch electrodes 214a and the second bridge lines 214b form a plurality of the touch electrode rows 214, and the touch electrode columns 213 and the touch electrode rows 214 are electrically connected to pads 217 through conductive lines 216. The protective layer 218 covers the touch electrode columns 213, the touch electrode rows 214 and the conductive lines 216, and the protective layer 218 has the openings 218a for exposing the pads 217, such that the pads 217 may be electrically connected to a flexible circuit board for transmitting/receiving sensing signals. In the embodiment shown in FIG. 7A to FIG. 7C, the materials of the first touch electrodes 213a and the second touch electrodes 214a may include transparent conductive material (such as indium tin oxide or indium zinc oxide), the materials of the first bridge lines 213b and the second bridge lines 214b may include metal material or transparent conductive material, and the materials of the conductive lines 216 and the pads 217 may include transparent conductive material, metal material or a combination thereof, but not limited thereto. When forming the flexible touch panel shown in FIG. 7A to FIG. 7C, the first bridge lines 213b may be formed on the buffer layer 140 disposed on the flexible substrate 130 (step S1), the insulation blocks 215 may be formed on the first bridge lines 213 and cover a portion of the first bridge lines 213b (step S2), and the first touch electrodes 213a, the second touch electrodes 214a and the second bridge lines 214b are formed (step S3), wherein the first touch electrodes 213a are coupled with the first bridge lines 213b, and the second bridge lines 214b are situated on the insulation blocks 215 to be electrically isolated to the first bridge lines 213b For example, a transparent conductive layer maybe formed, and then, the transparent conductive layer is patterned for forming the first touch electrodes 213a, the second touch electrodes 214a and the second bridge lines 214b, but not limited thereto. Next, a metal layer is formed, and then, the metal layer is patterned for forming the conductive lines 216 (step S4). Thereafter, the protective layer 218 having the opening 218a is formed, so as to cover the touch electrode columns 213, the touch electrode rows 214 and the conductive lines 216 and expose the pads 217. The pads 217 may be formed in step S1, step S3, step S4, or a combination thereof. The manufacturing method of the flexible touch panel is not limited thereto, for example, in another embodiment, step S1 may be changed to form the first touch electrodes 213a, the first bridge lines 213b and the second touch electrodes 214a on the buffer layer 140 disposed on the flexible substrate 130, and step S3 maybe changed to form the second bridge lines 214b on the insulation blocks 215, wherein the second bridge lines 214b are coupled with the second touch electrodes 214a.

Note that the first bridge lines 213b shown in FIG. 7A to FIG. 7C may be formed by patterning a first transparent conductive layer, the first touch electrodes 213a and the second touch electrodes 214a may be formed by patterning a second transparent conductive layer, and the conductive lines 216 are formed by patterning a metal layer. The protective layer 218 covers the first touch electrodes 213a, the second touch electrodes 214a and the conductive lines 216. As shown in FIG. 7B and FIG. 7C, the first touch electrodes 213a, the second touch electrodes 214a, the first bridge lines 213b, the conductive lines 216 and the protective layer 218 are in contact with the buffer layer 140, and therefore, the patterned first and second transparent conductive layer, the patterned metal layer and the protective layer 218 described above are the conductive layers and the insulation layer closest to the flexible substrate 130 in the device layer 150. In the embodiment of which the flexible panel PN1 is the flexible touch panel, the patterned conductive layer 151 shown in FIG. 6 may be corresponding to the patterned first transparent conductive layer including the first bridge lines 213b, the patterned second transparent conductive layer including the first touch electrodes 213a, the second touch electrodes 214a, and the patterned metal layer including the conductive lines 216 in FIG. 7A to FIG. 7C. The protective layer 152 shown in FIG. 6 may be corresponding to the protective layer 218 in FIG. 7A to FIG. 7C. Thus, if the difference between the thermal expansion coefficient of the flexible substrate 130 and the thermal expansion coefficient of at least one of the patterned first transparent conductive layer, the patterned second transparent conductive layer, the patterned metal layer and the protective layer 218 described above is greater than or equal to 10 ppm/° C., cracking or lifting up caused by the difference between the thermal expansion coefficient of the flexible substrate 130 and the thermal expansion coefficient of the conductive layer and/or the insulation layer of the device layer 150 closest to the flexible substrate 130 would be prevented by the disposition of the buffer layer 140.

Figure 8:
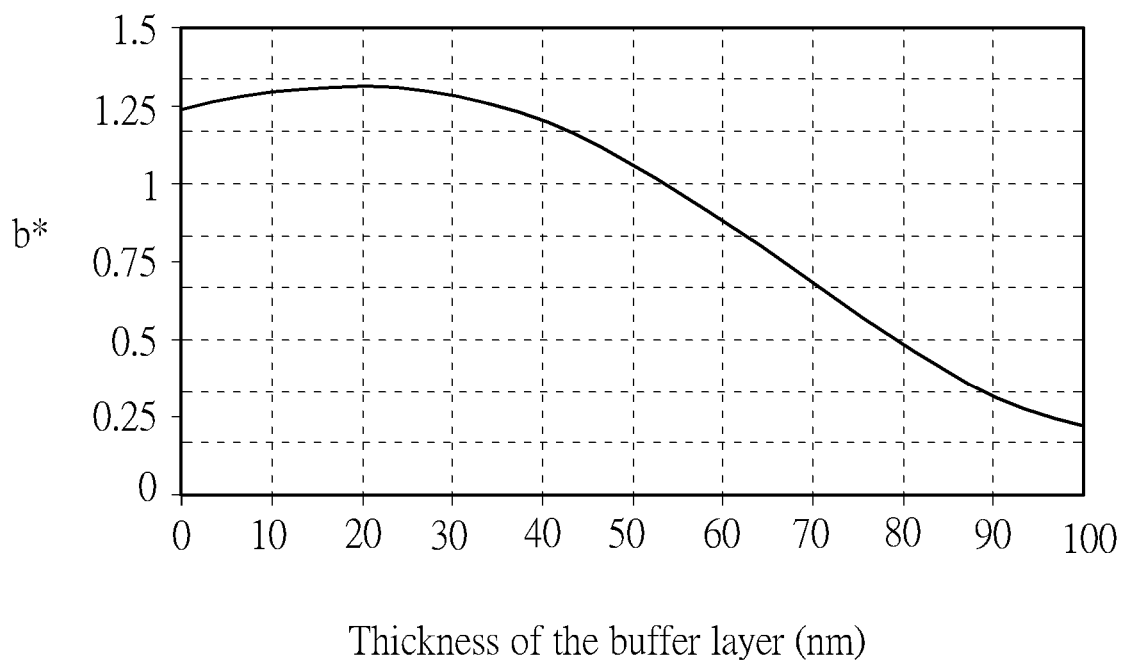
FIG. 8 is a schematic diagram of a relation between a thickness of the buffer layer and b* of the flexible panel according to the first embodiment of the present invention.

According to this embodiment, the disposition of the buffer layer 140 not only improves from the flexible substrate 130 being cracked or lifted up, but also may serve as an index matching layer of the flexible panel PN1 for adjusting color of the flexible panel PN1. That is, the buffer layer 140 adjusts color of transmitted light from the flexible panel PN1. According to CIE L*a*b*, normally, if b* of the flexible panel PN1 is greater than 1.5, the color of the flexible panel PN1 would be yellowish, such that a quality of display would be influenced. Thus, in this embodiment, b* of the flexible panel PN1 would be adjusted by the disposition of the buffer layer 140, so as to improve the quality of display. Referring to FIG. 8, FIG. 8 is a schematic diagram of a relation between a thickness of the buffer layer and b* of the flexible panel according to the first embodiment of the present invention. In this embodiment, the buffer layer 140 has the single-layer structure and the material of the buffer layer 140 is silicon oxide. As shown in FIG. 8, when a thickness of the buffer layer 140 is changed, b* of the flexible panel PN1 would be changed correspondingly, wherein when the thickness of the buffer layer 140 is greater than or equal to about 20 nanometers (nm) and smaller than or equal to about 100 nm, b* of the flexible panel PN1 decreases as the thickness of the buffer layer 140 increases. Generally, if the thickness of the buffer layer 140 is too small, the effect which the buffer layer 140 solves that the flexible substrate 130 is cracked or lifted up due to the difference between the thermal expansion coefficients of the flexible substrate 130 and the carrier substrate 110 (or the conductive layer and/or the insulation layer of the device layer 150 closest to the flexible substrate 130) would be reduced. If the thickness of the buffer layer 140 is too thick, a transmittance of the light would be decreased, so as to influence a brightness of the flexible panel PN1. Thus, in this embodiment, the thickness of the buffer layer 140 may be greater than or equal to 20 nm and smaller than or equal to 100 nm, such that b* of the flexible panel PN1 is smaller than 1.5 and the flexible substrate is prevented from cracking or being lifted up, but not limited thereto, the thickness of the buffer layer 140 may be adjusted depending on the requirement of b* of the flexible panel PN1. Furthermore, in this embodiment, the material of the patterned conductive layer 151 may include transparent conductive material (such as indium tin oxide), and a thickness of the patterned conductive layer 151 is about 100 nm for example, but not limited thereto.

In the manufacturing method of the flexible panel of the first embodiment and the flexible panel PN1 of the first embodiment, the disposition of the buffer layer 140 may prevent cracking or lifting up due to the difference between the thermal expansion coefficients of the flexible substrate 130 and the carrier substrate 110 and/or the difference between the thermal expansion coefficients of the flexible substrate 130 and the conductive layer and/or the insulation layer of the device layer 150 closest to the flexible substrate 130, and the disposition of the buffer layer 140 may serve as the index matching layer of the flexible panel PN1, so as to adjust the color of the flexible panel PN1.

The flexible panel and the manufacturing method of the flexible panel of the present invention are not limited to the above embodiments. Further embodiments or variant embodiments of the present invention are described below. To compare each of the embodiments or each of the variant embodiments conveniently and simplify the description, the same component would be labeled with the same symbol in the following. The description just descripts the differences between each of the embodiments, and repeated parts will not be redundantly described.

Figure 9:
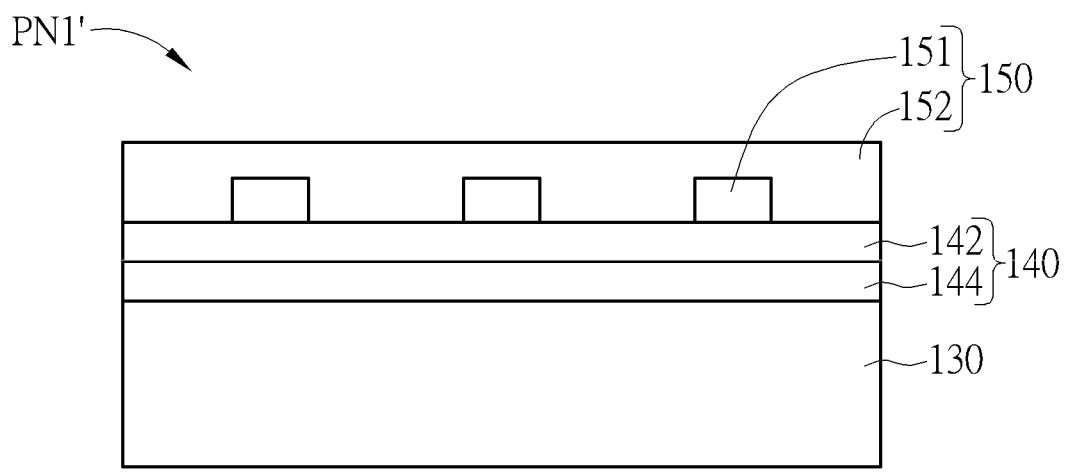
FIG. 9 is a schematic diagram of a cross-sectional view of a flexible panel according to a variant embodiment of the first embodiment of the present invention.

Referring to FIG. 9 to FIG. 10C, FIG. 9 is a schematic diagram of a cross-sectional view of a flexible panel according to a variant embodiment of the first embodiment of the present invention, and FIG. 10A to FIG. 10C are schematic diagrams of a relation between a thickness of the buffer layer and b* of the flexible panel according to the variant embodiment of the first embodiment of the present invention, wherein in FIG. 10A to FIG. 10C, the area separated by dashed lines and screentone is an area which b* is smaller than or equal to 1.5. As shown in FIG. 9, the difference between the flexible panel PN1' of this variant embodiment and the flexible panel PN1 of the first embodiment is that the buffer layer 140 of this variant embodiment is the multi-layer structure, and the buffer layer 140 of this variant embodiment has two layers for example, but not limited thereto. That is to say, the buffer layer 140 may include a first sub-buffer layer 142 and a second sub-buffer layer 144, the first sub-buffer layer 142 is disposed between the device layer 150 and the second sub-buffer layer 144, the second sub-buffer layer 144 is disposed between the flexible substrate 130 and the first sub-buffer layer 142, and a refractive index of the second sub-buffer layer 144 may be greater than a refractive index of the first sub-buffer layer 142. In another variant embodiment, the second sub-buffer layer 144 maybe disposed between the device layer 150 and the first sub-buffer layer 142, the first sub-buffer layer 142 may be disposed between the flexible substrate 130 and the second sub-buffer layer 144, and the refractive index of the second sub-buffer layer 144 maybe greater than the refractive index of the first sub-buffer layer 142. In this variant embodiment of FIG. 9, the first sub-buffer layer 142 may be silicon oxide for example, the refractive index of the second sub-buffer layer 144 may range from about 2.05 to about 2.45. The material of the second sub-buffer layer 144 may include niobium oxide ($Nb_2O_5$), but the material of the first sub-buffer layer 142 and the material and the range of the refractive index of the second sub-buffer layer 144 are not limited thereto. Note that the refractive indexes of the flexible substrate 130 and the first sub-buffer layer 142 may preferably be smaller than the refractive index of the second sub-buffer layer 144, and the refractive indexes of the first sub-buffer layer 142 and the protective layer 152 may preferably be smaller than the refractive index of the patterned conductive layer 151, such that the stacked flexible substrate 130/second sub-buffer layer 144/first sub-buffer layer 142/patterned conductive layer 151/protective layer 152 is a low/high/low/high/low refractive index layers stack, and the optical performance of the flexible panel PN1 may be further optimized, but not limited thereto. For example, when the flexible panel PN1 is a flexible touch panel, the materials of the flexible substrate 130, the second sub-buffer layer 144, the first sub-buffer layer 142 and the patterned conductive layer 151 may be respectively polyimide (PI), niobium oxide ($Nb_2O_5$), silicon oxide and indium tin oxide (ITO), and the refractive index of the protective layer 152 is smaller than that of the patterned conductive layer 151, but not limited thereto. In addition, the refractive index of the flexible substrate 130 may range from about 1.5 to about 1.7, the refractive index of the second sub-buffer layer 144 may range from about 2.05 to about 2.45, the refractive index of the first sub-buffer layer 142 may range from about 1.4 to about 1.6, the refractive index of the patterned conductive layer 151 may range from about 1.7 to about 1.9, and the refractive index of the protective layer 152 may range from about 1.4 to about 1.6, but not limited thereto. Furthermore, the thicknesses of the flexible substrate 130 may range from about 5 to about 35 micrometers (μm), the thicknesses of the patterned conductive layer 151 may range from about 5 to about 200 nanometers (nm), and the protective layer 152 may range from about 0.5 to about 4 μm, but not limited thereto. For example, the thicknesses of the flexible substrate 130, the patterned conductive layer 151 and the protective layer 152 may be respectively about 9.5 μm, about 100 nm and about 2 μm, and the refractive indexes of the flexible substrate 130, the first sub-buffer layer 142, the patterned conductive layer 151 and the protective layer 152 may be respectively about 1.6, about 1.48, about 1.82 and about 1.53, but not limited thereto. As shown in FIG. 10A to FIG. 10C, when at least one of a thickness of the first sub-buffer layer 142 and a thickness of the second sub-buffer layer 144 is changed, b* of the flexible panel PN1' would be changed correspondingly. The different refractive indexes of the second sub-buffer layer 144 are shown in FIG. 10A to FIG. 10C respectively. For example, the refractive index of the second sub-buffer layer 144 is 2.05 in FIG. 10A, the refractive index of the second sub-buffer layer 144 is 2.25 in FIG. 10B, the refractive index of the second sub-buffer layer 144 is 2.45 in FIG. 10C.

As shown in FIG. 10A and FIG. 10B, in order to make b* of the flexible panel PN1' be smaller than or equal to 1.5, when the refractive index of the second sub-buffer layer 144 ranges from 2.05 to 2.25, the thickness of the first sub-buffer layer 142 and the thickness of the second sub-buffer layer 144 would satisfy conditions shown in following table 1.

TABLE 1 the thickness of the first sub-buffer layer and the thickness of the second sub-buffer layer in the condition that b* is smaller than or equal to 1.5 and the refractive index of the second sub-buffer layer ranges from 2.05 to 2.25

| Thickness of the second sub-buffer layer 144 | Thickness of the first sub-buffer layer 142 |
|---|---|
| Greater than 0 nm and less than or equal to 5 nm | 0~10 nm or 70 nm~100 nm |
| Greater than 5 nm and less than or equal to 10 nm | 85 nm~100 nm |
| Greater than 10 nm and less than 30 nm | 90 nm~100 nm |
| Greater than or equal to 30 nm and less than 40 nm | 85 nm~100 nm |
| Greater than or equal to 40 nm and less than 45 nm | 80 nm~100 nm |
| Greater than or equal to 45 nm and less than 50 nm | 75 nm~100 nm |
| Greater than or equal to 50 nm and less than 55 nm | 70 nm~100 nm |
| Greater than or equal to 55 nm and less than 60 nm | 65 nm~100 nm |
| Greater than or equal to 60 nm and less than 65 nm | 60 nm~100 nm |
| Greater than or equal to 65 nm and less than 70 nm | 50 nm~100 nm |
| Greater than or equal to 70 nm and less than 75 nm | 45 nm~100 nm |
| Greater than or equal to 75 nm and less than 80 nm | 35 nm~100 nm |
| Greater than or equal to 80 nm and less than 85 nm | 25 nm~100 nm |
| Greater than or equal to 85 nm and less than 90 nm | 15 nm~100 nm |
| Greater than or equal to 90 nm and less than 95 nm | 5 nm~100 nm |
| Greater than or equal to 95 nm and less than or equal to 100 nm | 0~100 nm |

In other words, the first sub-buffer layer 142 and the thickness of the second sub-buffer layer 144 would satisfy one of following conditions (a) to (e), wherein (a) 0 nm<the thickness of the second sub-buffer layer 144≤5 nm, and 0 nm<the thickness of the first sub-buffer layer 142≤10 nm or 70 nm≤the thickness of the first sub-buffer layer 142≤100 nm;

(b) 5 nm<the thickness of the second sub-buffer layer 144<40 nm, and the first sub-buffer layer 142 and the second sub-buffer layer 144 satisfy one of following conditions (b_1) to (b_3):

(b_1) when 5 nm<the thickness of the second sub-buffer layer 144≤10 nm, 85 nm≤the thickness of the first sub-buffer layer 142≤100 nm;

(b_2) when 10 nm<the thickness of the second sub-buffer layer 144<30 nm, 90 nm≤the thickness of the first sub-buffer layer 142≤100 nm;

(b_3) when 30 nm≤the thickness of the second sub-buffer layer 144<40 nm, 85 nm≤the thickness of the first sub-buffer layer 142≤100 nm;

(c) 40 nm≤the thickness of the second sub-buffer layer 144<65 nm, and the first sub-buffer layer 142 and the second sub-buffer layer 144 satisfy following condition: when (40+5Z) nm≤the thickness of the second sub-buffer layer 144<(40+5(Z+1)) nm, (U−5Z) nm≤the thickness of the first sub-buffer layer 142≤100 nm, wherein Z is an integer from 0 to 4, and U is 80;

(d) 65 nm≤the thickness of the second sub-buffer layer 144<95 nm, and the first sub-buffer layer 142 and the second sub-buffer layer 144 satisfy following condition: when (65+5Z) nm≤the thickness of the second sub-buffer layer 144<(65+5(Z+1)) nm, (U−10Z) nm≤the thickness of the first sub-buffer layer 142≤100 nm, wherein Z is an integer from 0 to 5, U is 50 when Z is 0, and U is 55 when Z is the integer from 1 to 5;

(e) 95 nm≤the thickness of the second sub-buffer layer 144≤100 nm, and 0 nm<the thickness of the first sub-buffer layer 142≤100 nm.

Furthermore, As shown in FIG. 10B and FIG. 10C, in order to make b* of the flexible panel PN1' be smaller than or equal to 1.5, when the refractive index of the second sub-buffer layer 144 ranges from 2.25 to 2.45, the thickness of the first sub-buffer layer 142 and the thickness of the second sub-buffer layer 144 would satisfy conditions shown in following table 2.

TABLE 2 the thickness of the first sub-buffer layer and the thickness of the second sub-buffer layer in the condition that b* is smaller than or equal to 1.5 and the refractive index of the second sub-buffer layer ranges from 2.25 to 2.45

| Thickness of the second sub-buffer layer 144 | Thickness of the first sub-buffer layer 142 |
|---|---|
| Greater than 0 nm and less than or equal to 5 nm | 0~5 nm or 75 nm~100 nm |
| Greater than 5 nm and less than or equal to 10 nm | 90 nm~100 nm |
| Greater than 10 nm and less than 25 nm | 95 nm~100 nm |
| Greater than or equal to 25 nm and less than 30 nm | 90 nm~100 nm |
| Greater than or equal to 30 nm and less than 40 nm | 85 nm~100 nm |
| Greater than or equal to 40 nm and less than 45 nm | 80 nm~100 nm |
| Greater than or equal to 45 nm and less than 50 nm | 75 nm~100 nm |
| Greater than or equal to 50 nm and less than 55 nm | 65 nm~100 nm |
| Greater than or equal to 55 nm and less than 60 nm | 60 nm~100 nm |
| Greater than or equal to 60 nm and less than 65 nm | 50 nm~100 nm |
| Greater than or equal to 65 nm and less than 70 nm | 40 nm~100 nm |
| Greater than or equal to 70 nm and less than 75 nm | 30 nm~100 nm |
| Greater than or equal to 75 nm and less than 80 nm | 15 nm~100 nm |
| Greater than or equal to 80 nm and less than 95 nm | 0 nm~100 nm |
| Greater than 95 nm and less than or equal to 100 nm | 0~95 nm |

In other words, the first sub-buffer layer 142 and the thickness of the second sub-buffer layer 144 would satisfy one of following conditions (f) to (j), wherein (f) 0 nm<the thickness of the second sub-buffer layer 144≤5 nm, and 0 nm<the thickness of the first sub-buffer layer 142≤5 nm or 75 nm≤the thickness of the first sub-buffer layer 142≤100 nm;

(g) 5 nm<the thickness of the second sub-buffer layer 144<25 nm, and the first sub-buffer layer 142 and the second sub-buffer layer 144 satisfy one of following conditions (g_1) and (g_2):

(g_1) when 5 nm<the thickness of the second sub-buffer layer 144≤10 nm, 90 nm≤the thickness of the first sub-buffer layer 142≤100 nm;

(g_2) when 10 nm<the thickness of the second sub-buffer layer 144<25 nm, 95 nm≤the thickness of the first sub-buffer layer 142≤100 nm;

(h) 25 nm≤the thickness of the second sub-buffer layer 144<55 nm, and the first sub-buffer layer 142 and the second sub-buffer layer 144 satisfy following condition: when (25+5Z) nm≤the thickness of the second sub-buffer layer 144<(25+5(Z+1)) nm, U nm≤the thickness of the first sub-buffer layer 142≤100 nm, wherein Z is an integer from 0 to 5, U is 90 when Z is 0, U is 85 when Z is 1 or 2, U is 80 when Z is 3, U is 75 when Z is 4, and U is 65 when Z is 5;

(i) 55 nm≤the thickness of the second sub-buffer layer 144<75 nm, and the first sub-buffer layer 142 and the second sub-buffer layer 144 satisfy following condition: when (55+5Z) nm≤the thickness of the second sub-buffer layer 144<(55+5(Z+1)) nm, (U−10Z) nm≤the thickness of the first sub-buffer layer 142≤100 nm, wherein Z is an integer from 0 to 3, and U is 60;

(j) 75 nm≤the thickness of the second sub-buffer layer 144≤100 nm, and the first sub-buffer layer 142 and the second sub-buffer layer 144 satisfy one of following conditions (j_1) to (j_3):

(j_1) when 75 nm≤the thickness of the second sub-buffer layer 144<80 nm, 15 nm≤the thickness of the first sub-buffer layer 142≤100 nm;

(j_2) when 80 nm≤the thickness of the second sub-buffer layer 144≤95 nm, 0 nm<the thickness of the first sub-buffer layer 142≤100 nm;

(j_3) when 95 nm<the thickness of the second sub-buffer layer 144≤100 nm, 0 nm<the thickness of the first sub-buffer layer 142≤95 nm.

But, the thickness of the first sub-buffer layer 142 and the thickness of the second sub-buffer layer 144 are not limited thereto, the thickness of the first sub-buffer layer 142 and the thickness of the second sub-buffer layer 144 may be adjusted depending on the requirement b* of the flexible panel PN1'.

Figure 11A:
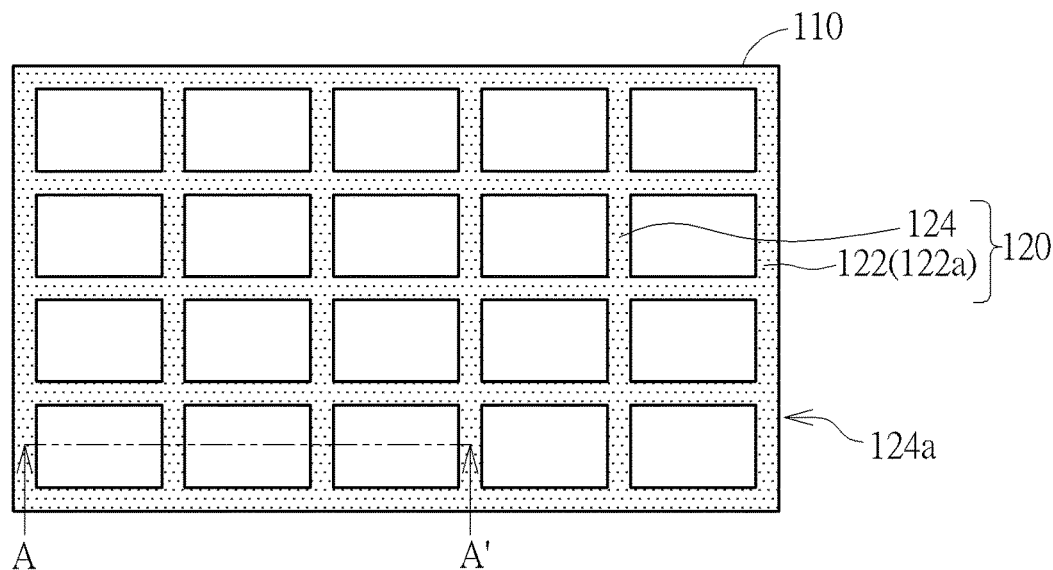
FIG. 11A is a schematic diagram of a top view of a flexible panel according to another variant embodiment of the first embodiment of the present invention.
Figure 11B:
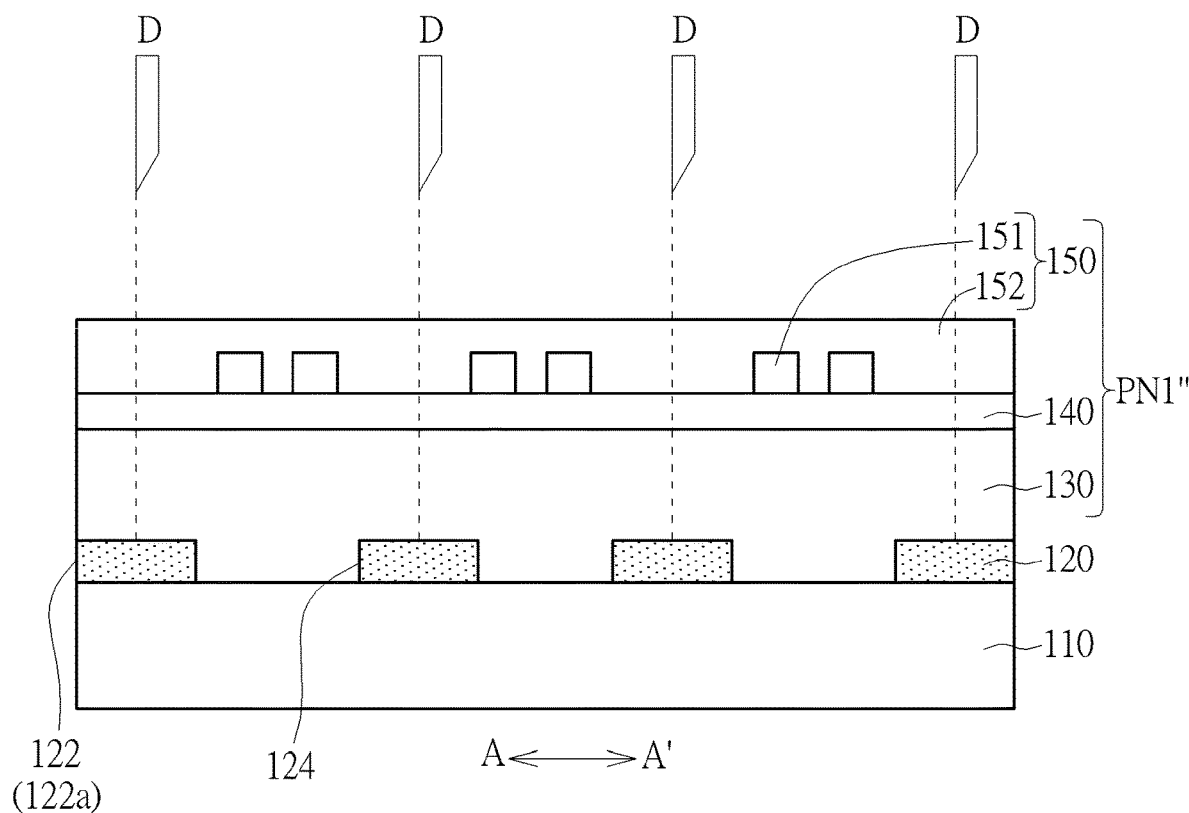
FIG. 11B is a schematic diagrams of a cross-sectional view taken along the cross-sectional line A-A' in FIG. 11A.

Referring to FIG. 11A and FIG. 11B, FIG. 11A is a schematic diagram of a top view of a flexible panel according to another variant embodiment of the first embodiment of the present invention, and FIG. 11B is a schematic diagrams of a cross-sectional view taken along the cross-sectional line A-A' in FIG. 11A, wherein FIG. 11A only shows the carrier substrate 110 and the adhesion layer 120. As shown in FIG. 11A, the difference between the manufacturing method of the flexible panel of this variant embodiment and the manufacturing method of the flexible panel of the first embodiment is the adhesion layer 120 of this variant embodiment further includes a plurality of second strip adhesion structures 124 disposed in the frame adhesion structure 122a and interlaced with each other, and the frame adhesion structure 122a and the second strip adhesion structures 124 form a mesh-shape adhesion structure 124a having multiple openings. That is to say, the mesh-shape adhesion structure 124a of the adhesion layer 120 may be formed of the first strip adhesion structures 122 and the second strip adhesion structures 124. In this variant embodiment, the width of the first strip adhesion structure 122 and a width of the second strip adhesion structure 124 may be the same, and the width may be smaller than or equal to 2 cm, but not limited thereto. In the embodiment shown in FIG. 11A, the edges of the frame adhesion structure 122a overlap the edges of the carrier substrate 110, but not limited thereto. In another embodiment, the distance exists between the edge of the frame adhesion structure 122a and the edge of the carrier substrate 110. In this variant embodiment, a plurality of the flexible panels PN1" are formed on the carrier substrate 110 and the adhesion layer 120, and each of the flexible panels PN1" is corresponding to an opening of the mesh-shape adhesion structure 124a, but not limited thereto. As shown in FIG. 11B, in the embodiment shown in FIG. 11B, before the separating process is performed, the flexible panels PN1" may be cut along a cutting line D, then, the adhesive force between the adhesion layer 120 and the flexible substrate 130 may be decreased, and next, the flexible substrate 130 would be separated from the carrier substrate 110/the adhesion layer 120, so as to complete the separation of the flexible panels PN1". Moreover, in another embodiment, before performing the separating process, a transition layer utilized for supporting the flexible substrate 130 and the device layer 150 may be disposed on a surface of the device layer 150 which do not face to the flexible substrate 130, the adhesive force between the adhesion layer 120 and the flexible substrate 130 may be decreased, and then, the flexible substrate 130 would be separated from the carrier substrate 110/the adhesion layer 120. Next, the flexible panels PN1" are cut along the cutting line D. Thereafter, the transition layer is removed, so as to complete the separation of the flexible panels PN1".

Figure 12:
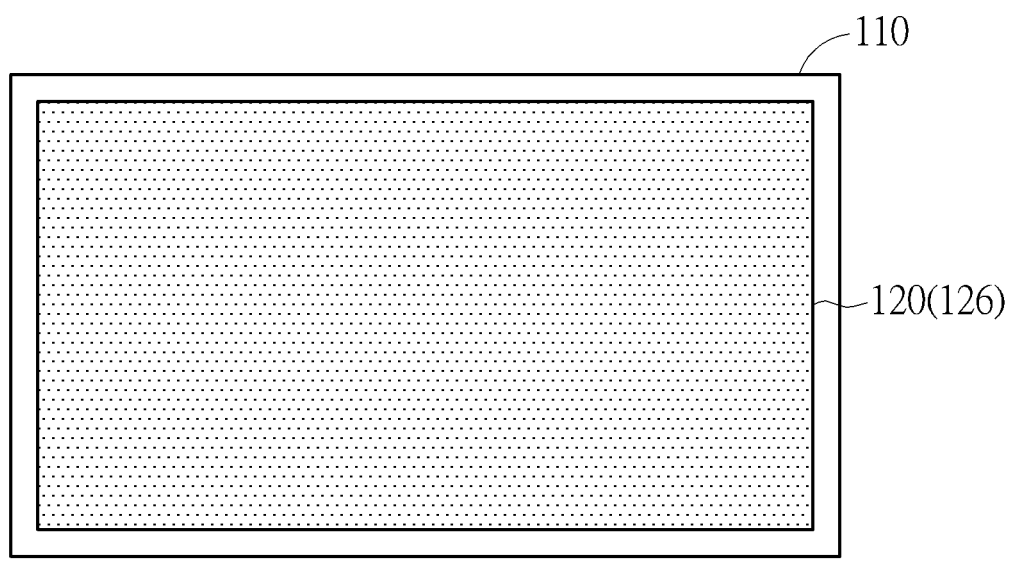
FIG. 12 to FIG. 13B are schematic diagrams of a top view of a manufacturing method of a flexible panel according to a second embodiment of the present invention.
Figure 13A:
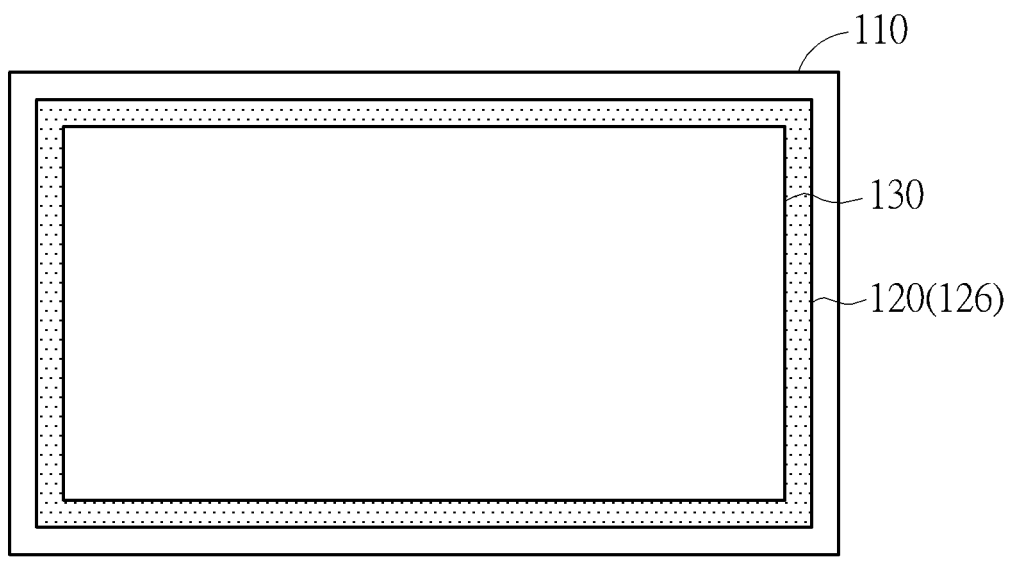
Figure 13B:
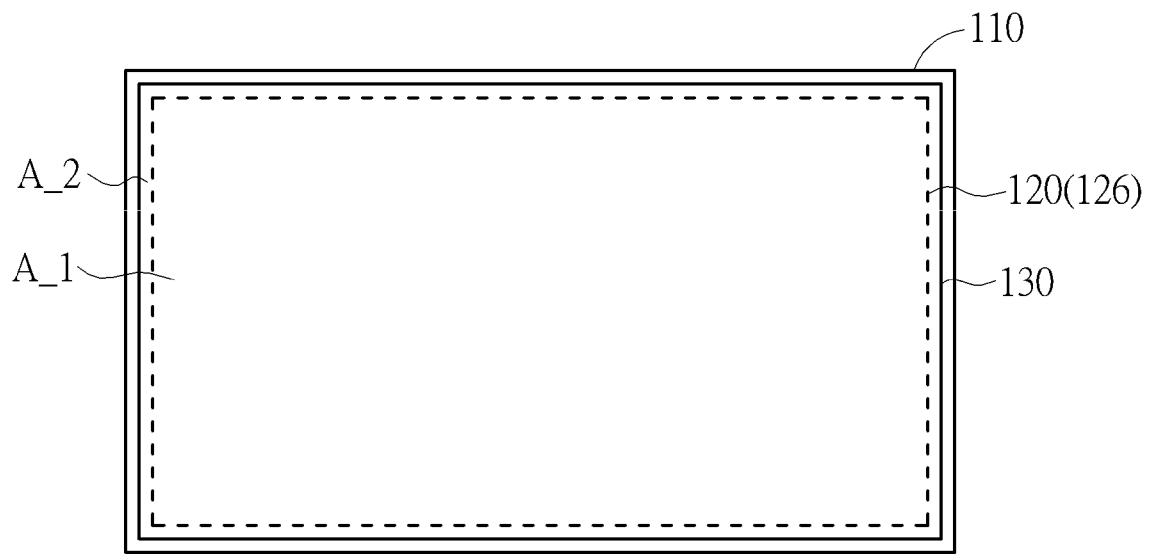
Figure 14A:
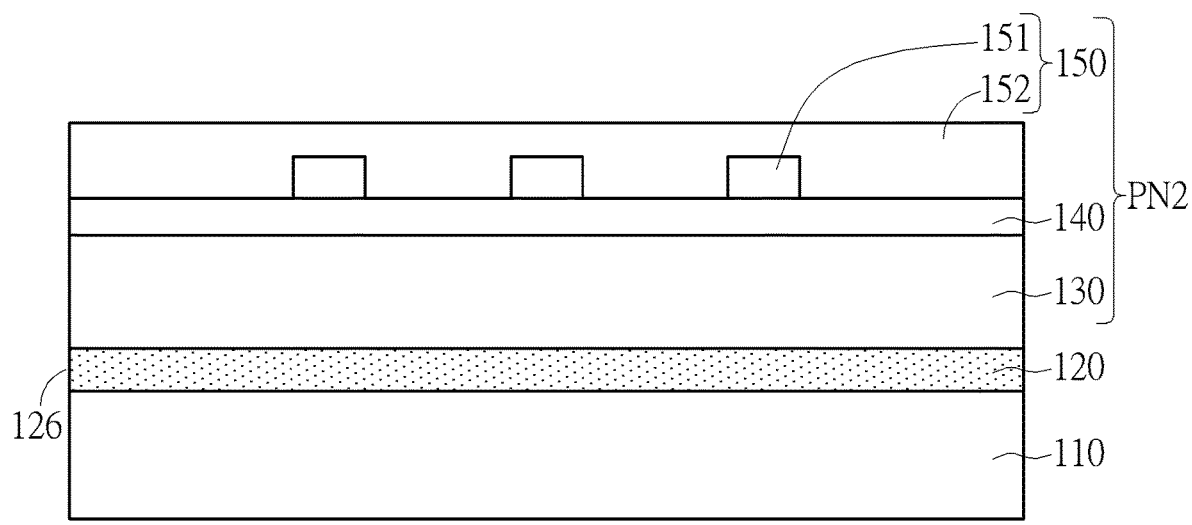
FIG. 14A to FIG. 15 are schematic diagrams of a cross-sectional view of the manufacturing method of the flexible panel according to the second embodiment of the present invention.
Figure 14B:
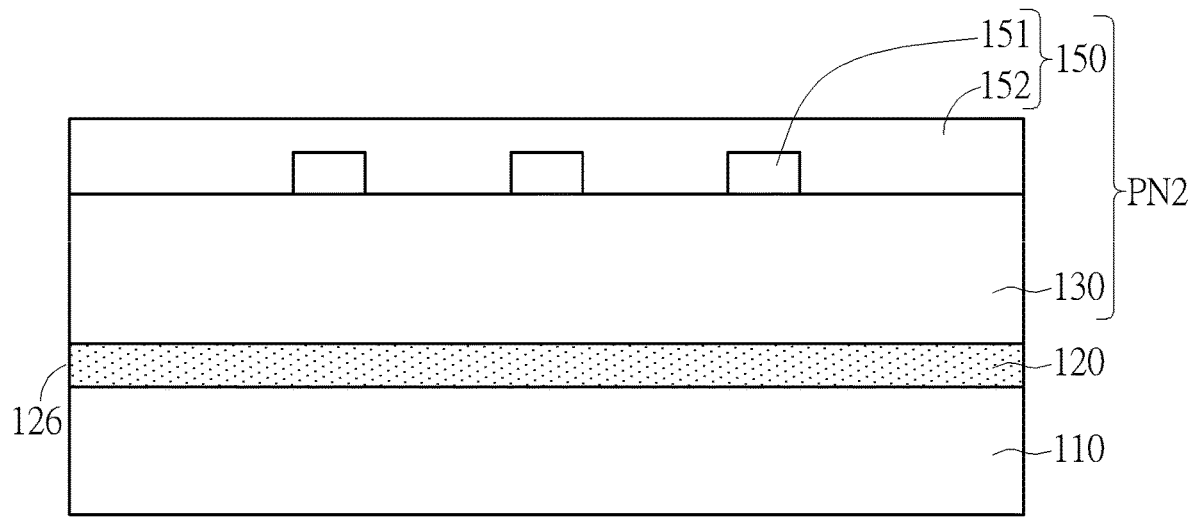
Figure 15:
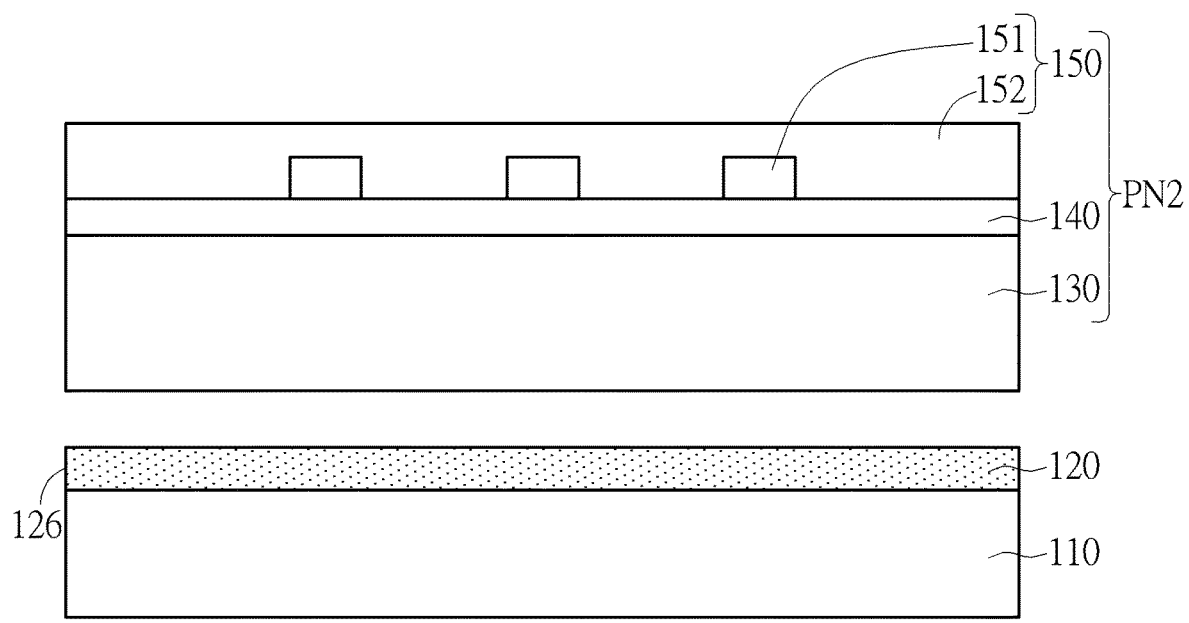

Referring to FIG. 12 to FIG. 15, FIG. 12 to FIG. 13B are schematic diagrams of a top view of a manufacturing method of a flexible panel according to a second embodiment of the present invention, and FIG. 14A to FIG. 15 are schematic diagrams of a cross-sectional view of the manufacturing method of the flexible panel according to the second embodiment of the present invention, wherein FIG. 12 only shows the carrier substrate 110 and the adhesion layer 120, and FIG. 13A and FIG. 13B only show the carrier substrate 110, the adhesion layer 120 and the flexible substrate 130. The manufacturing method of the flexible panel of this embodiment may be suitable for using in following conditions: (1) the difference between the thermal expansion coefficient of the flexible substrate 130 and the thermal expansion coefficient of the carrier substrate 110 is greater than or equal to 10 ppm/° C., and the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C. (corresponding to FIG. 14A); or (2) the difference between the thermal expansion coefficient of the flexible substrate 130 and the thermal expansion coefficient of the carrier substrate 110 is greater than or equal to 10 ppm/° C., and the difference between the thermal expansion coefficient of the flexible substrate 130 and the thermal expansion coefficient of the conductive layer and/or the insulation layer of the device layer 150 closest to the flexible substrate 130 is smaller than 10 ppm/° C. (corresponding to FIG. 14B). As shown in FIG. 12, according to the manufacturing method of the flexible panel of the second embodiment of the present invention, firstly, the carrier substrate 110 is provided, then, the adhesion layer 120 is formed on the carrier substrate 110, and the adhesion layer 120 is formed to include a plane adhesion structure (also known as a block-type adhesion structure) 126. In this embodiment, a shape of the plane adhesion structure 126 is rectangular, but not limited thereto. The difference between the plane adhesion structure 126 of this embodiment and the frame adhesion structure 122a of the first embodiment is that the plane adhesion structure 126 does not have the opening. On the contrary, the frame adhesion structure 122a of the first embodiment includes the opening 122a', and the flexible substrate 130 is in contact with the carrier substrate 110 through the opening 122a'. Comparing to the first embodiment, note that the adhesion between the adhesion layer 120 and the flexible substrate 130 of this embodiment is less than the adhesion between the adhesion layer 120 and the flexible substrate 130 of the first embodiment. That is to say, the material chosen for the adhesion layer 120 of this embodiment is different from the material chosen for the adhesion layer 120 of the first embodiment. In this embodiment, an adhesive force between the adhesion layer 120 and the carrier substrate 110 is greater than an adhesive force between the adhesion layer 120 and the flexible substrate 130, such that the flexible substrate 130 may be separated from the adhesion layer 120, and the adhesion layer 120 would remain on the carrier substrate 110, but not limited thereto.

Next, the flexible substrate 130 is formed on the adhesion layer 120, wherein an area of the plane adhesion structure 126 of the adhesion layer 120 is greater than an area of the flexible substrate 130 (as shown in FIG. 13A) or equal to the area of the flexible substrate 130 (not shown). That is to say, an orthogonal projection of the flexible substrate 130 projected on the carrier substrate 110 is situated within an orthogonal projection of the adhesion layer 120 projected on the carrier substrate 110, or the orthogonal projection of the flexible substrate 130 on the carrier substrate 110 totally overlaps the orthogonal projection of the adhesion layer 120 on the carrier substrate 110 (the whole flexible substrate 130 is disposed on the adhesion layer 120 and directly contact the adhesion layer 120), such that the flexible substrate 130 is not in contact with the carrier substrate 110 but in contact with the adhesion layer 120, but not limited thereto. In another embodiment, the area of the plane adhesion structure 126 of the adhesion layer 120 may be also smaller than the area of the flexible substrate 130 (as shown in FIG. 13B). That is, the orthogonal projection of the adhesion layer 120 projected on the carrier substrate 110 is situated within the orthogonal projection of the flexible substrate 130 projected on the carrier substrate 110, such that most of the flexible substrate 130 (corresponding to a region A_1 in FIG. 13B) is in contact with the adhesion layer 120, and a rest portion of the flexible substrate 130 (corresponding to a region A_2 in FIG. 13B) is in contact with the carrier substrate 110 along the edges of the adhesion layer 120. That is to say, a periphery portion of the flexible substrate 130 is in contact with the carrier substrate 110. An area of the region A_1 is greater than an area of the region A_2, that is to say, an area which the flexible substrate 130 is in contact with the adhesion layer 120 is greater than an area which the flexible substrate 130 is in contact with the carrier substrate 110. Since the flexible substrate 130 is in contact with the adhesion layer 120 directly, the flexible substrate 130 may be adhered on the carrier substrate 110 by the adhesive force provided from the adhesion layer 120. Then, the device layer 150 is formed on the flexible substrate 130, so as to form at least one flexible panel PN2. The materials and the uses of the flexible substrate 130, the patterned conductive layer 151 and the protective layer 152 are the same as that of the flexible panel of the first embodiment, and will not be redundantly described.

In this embodiment, note that if the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C., the buffer layer 140 is formed on the flexible substrate 130 before forming the device layer 150, such that the buffer layer 140 is situated between the flexible substrate 130 and the device layer 150, so as to separate the flexible substrate 130 and the device layer 150 and make the flexible substrate 130 be not in contact with the device layer 150 directly, as shown in FIG. 14A. The material and the structure of the buffer layer 140 are the same as the manufacturing method of the flexible panel of the first embodiment of the present invention, and will not be redundantly described. On the other hand, in this embodiment, if the difference between the thermal expansion coefficient of the flexible substrate 130 and the thermal expansion coefficient of the conductive layer and/or the insulation layer of the device layer 150 closest to the flexible substrate 130 is smaller than 10 ppm/° C., the buffer layer 140 may be disposed selectively. That is, the buffer layer 140 may not be disposed between the flexible substrate 130 and the device layer 150, such that the flexible substrate 130 is in contact with the device layer 150 directly, as shown in FIG. 14B.

For example, when the flexible panel PN2 is the flexible touch panel shown in FIG. 7A and FIG. 7B, if the difference between the thermal expansion coefficient of the flexible substrate 130 and the thermal expansion coefficient of at least one of the first touch electrodes 213a, the second touch electrodes 214a, the conductive lines 216 and the protective layer 218 is greater than or equal to 10 ppm/° C., the buffer layer 140 would be formed on the flexible substrate 130 before forming the device layer 150, such that the buffer layer 140 is situated between the flexible substrate 130 and the device layer 150, so as to separate the flexible substrate 130 and the device layer 150 and make the flexible substrate 130 be not in contact with the device layer 150 directly. Thus, cracking or lifting up caused by the difference between the thermal expansion coefficient of the flexible substrate 130 and the thermal expansion coefficient of the conductive layer and/or the insulation layer of the device layer 150 closest to the flexible substrate 130 may be prevented.

As shown in FIG. 15, the separating process is performed, such that the flexible panel PN2 is separated from the carrier substrate 110, so as to complete the manufacture of the flexible panel PN2. In this embodiment, the method of separating the flexible panel PN2 and the carrier substrate 110 may be that one end of the flexible panel PN2 is clamped by the clamping fixture and the flexible panel PN1 is separated from the carrier substrate 110 with suitable angle and velocity, so as to increase a success rate of separation, but the method of separating is not limited thereto. In addition, before performing the separating process, the cutting process may be performed selectively, wherein the cutting process may be performed by laser cutting, mechanical cutting, punching or other suitable methods. For example, in the embodiment shown in FIG. 13B, the cutting process may cut along the edges of the region A_1, and then, the separating process is performed. Similarly, in order to simply, only one flexible panel PN2 is formed on the carrier substrate 110 for example in the above description. In an embodiment of which a plurality of the flexible panels PN2 are formed on the carrier substrate 110, the difference is that a step which the flexible panels PN2 are cut needs to be performed after performing the separating process. The rest steps are the same as above, and will not be redundantly described. Moreover, in the embodiment of which the flexible panels PN2 are formed on the carrier substrate 110, the step of cutting the flexible panels PN2 may be performed before the separating process is performed. That is to say, the cutting process would cut and form the flexible panels PN2 on the carrier substrate 110, and then, the flexible panels PN2 would be separated from the carrier substrate 110.

According to the manufacturing method of the flexible panel of this embodiment, although the difference between the thermal expansion coefficient of the flexible substrate 130 and the thermal expansion coefficient of the carrier substrate 110 is greater than or equal to 10 ppm/° C., the flexible substrate 130 is totally in contact with the adhesion layer 120 directly and not in contact with the carrier substrate 110, or most of the flexible substrate 130 is in contact with the adhesion layer 120 directly (only the periphery portion of the flexible substrate 130 is in contact with the carrier substrate 110). Therefore, when the temperature is changed in the manufacturing process, the thermal expansion of the carrier substrate 110 and the thermal expansion of the flexible substrate 130 do not directly influence each other, so as to reduce the stress and prevent the flexible substrate 130 from being cracked or lifted up, and increase the yield rate of the flexible panel PN2. On the other hand, if the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C. also, the buffer layer 140 of the embodiment shown in FIG. 14A (one type of this embodiment) is formed on the total surface of the flexible substrate 130, the flexible substrate 130 is not in contact with the device layer 150 directly, such that the thermal expansion of the device layer 150 and the thermal expansion of the flexible substrate 130 do not directly influence each other, so as to reduce the stress and prevent the flexible substrate 130 from being cracked or lifted up, and increase the yield rate of the flexible panel PN2. That is to say, if the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C. also, cracking or lifting up caused by the difference between the thermal expansion coefficient of the flexible substrate 130 and the thermal expansion coefficient of the conductive layer and/or the insulation layer of the device layer 150 closest to the flexible substrate 130 can be prevented by forming the buffer layer 140 on the total surface of the flexible substrate 130.

In addition, the disposition of the buffer layer 140 may serve as the index matching layer of the flexible panel PN2 for adjusting color of the flexible panel PN2. That is, the buffer layer 140 adjusts the color of the transmitted light from the flexible panel PN2. The disposition and the thickness of the buffer layer 140 in this embodiment are the same as that of the buffer layer 140 of the flexible panel PN1 of the first embodiment (the buffer layer having the single-layer structure) or the same as that of the buffer layer 140 of the flexible panel PN1' of the variant embodiment of the first embodiment (the buffer layer having the multi-layer structure), and will not be redundantly described.

Figure 16:
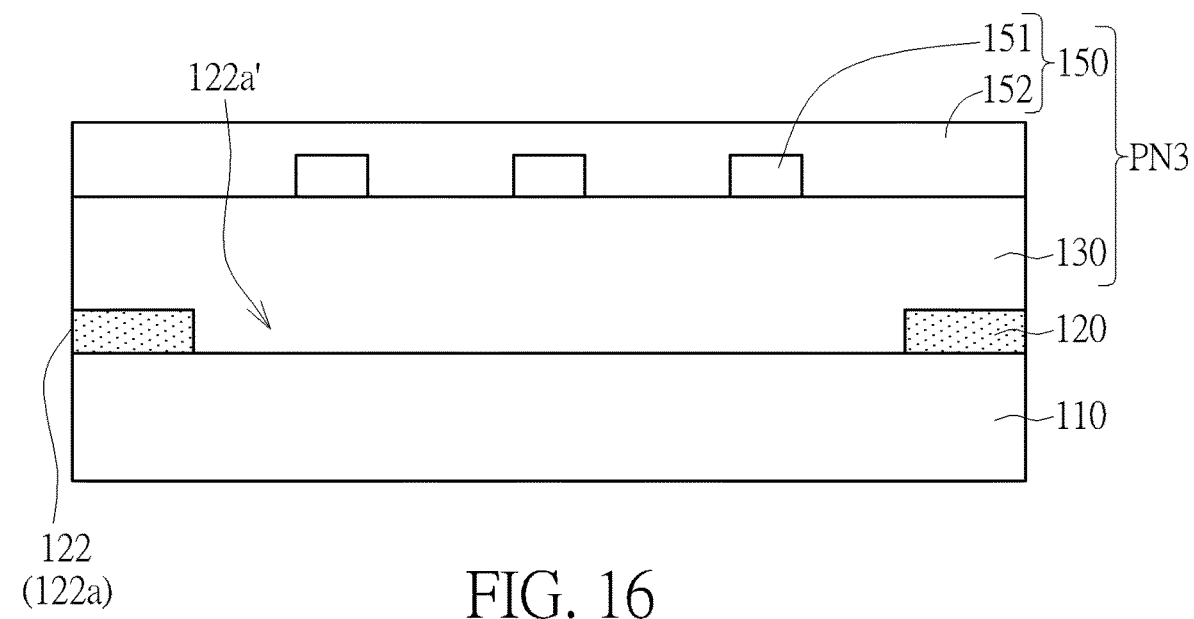
FIG. 16 and FIG. 17 are schematic diagrams of a cross-sectional view of a manufacturing method of a flexible panel according to a third embodiment of the present invention.
Figure 17:
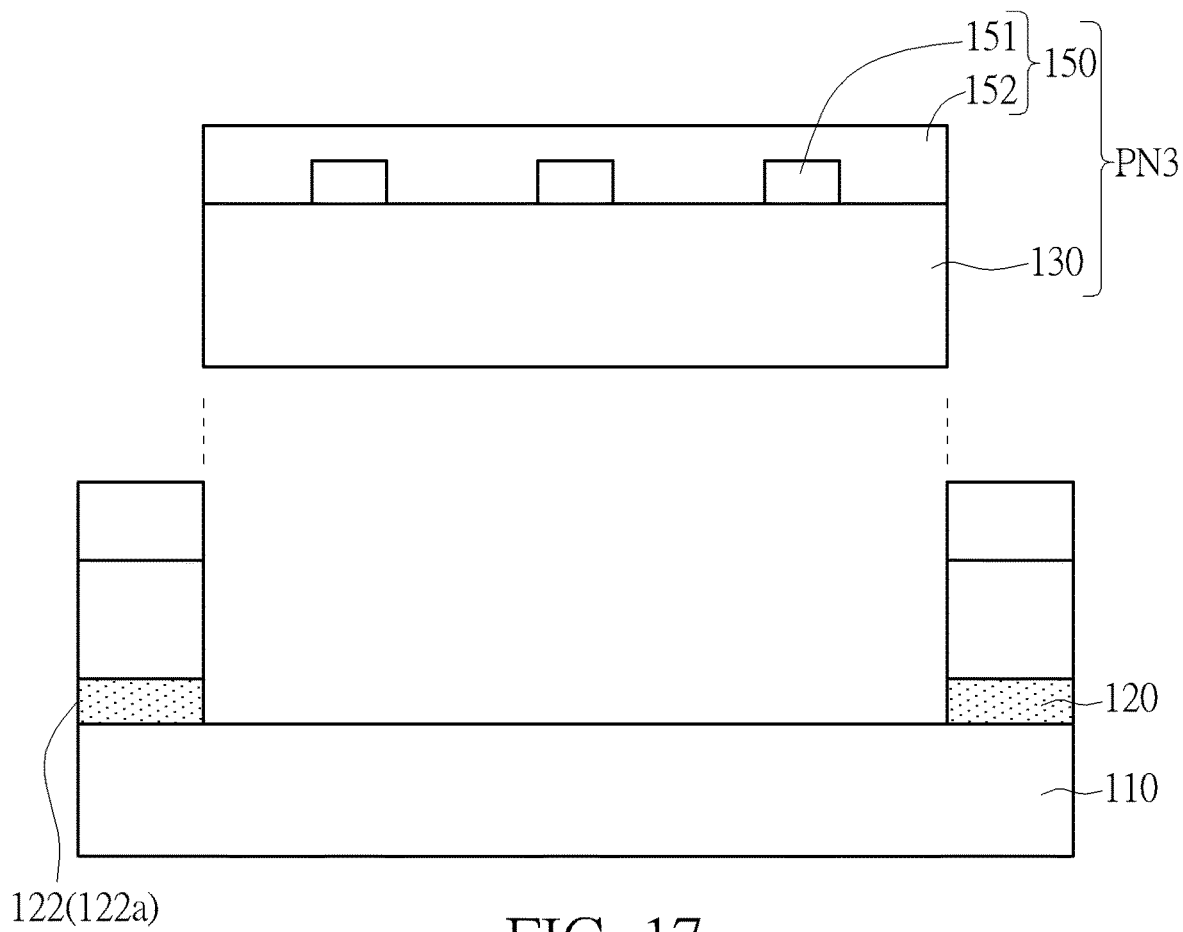

Referring to FIG. 16 and FIG. 17, FIG. 16 and FIG. 17 are schematic diagrams of a cross-sectional view of a manufacturing method of a flexible panel according to a third embodiment of the present invention. The manufacturing method of the flexible panel of this embodiment maybe suitable for a condition that the difference between the thermal expansion coefficient of the flexible substrate 130 and the thermal expansion coefficient of the carrier substrate 110 is smaller than 10 ppm/° C. and the difference between the thermal expansion coefficient of the flexible substrate 130 and the thermal expansion coefficient of the conductive layer and/or the insulation layer of the device layer 150 closest to the flexible substrate 130 is smaller than 10 ppm/° C. As shown in FIG. 16, according to the manufacturing method of the flexible panel of the third embodiment of the present invention, firstly, the carrier substrate 110 is provided, then, the adhesion layer 120 is formed on the carrier substrate 110, the adhesion layer 120 is formed to include the frame adhesion structure 122a, and the frame adhesion structure 122a includes the opening 122a'. Next, the flexible substrate 130 is formed on the adhesion layer 120, most of the flexible substrate 130 may be in contact with the carrier substrate 110 through the opening 122a' of the frame adhesion structure 122a. Then, the device layer 150 is formed on the flexible substrate 130, such that the flexible substrate 130 and the device layer 150 form at least one flexible panel PN3. Thereafter, as shown in FIG. 17, the separating process is performed for separating the flexible panel PN3 from the carrier substrate 110, so as to complete the manufacture of the flexible panel PN3. The materials and the uses of the carrier substrate 110, the adhesion layer 120, the flexible substrate 130, the patterned conductive layer 151 and the protective layer 152 of this embodiment are the same as that of the first embodiment of the present invention, the separating process of this embodiment is the same as that of the first embodiment of the present invention, and will not be redundantly described.

In the manufacturing method of the flexible panel of this embodiment, note that because the difference between the thermal expansion coefficient of the flexible substrate 130 and the thermal expansion coefficient of the conductive layer and/or the insulation layer of the device layer 150 closest to the flexible substrate 130 is smaller than 10 ppm/° C., the device layer 150 may be directly disposed on the flexible substrate 130 and in contact with the flexible substrate 130 directly. According to the manufacturing method of the flexible panel of this embodiment, since the difference between the thermal expansion coefficient of the flexible substrate 130 and the thermal expansion coefficient of the carrier substrate 110 is smaller than 10 ppm/° C., the difference between the thermal expansion of the flexible substrate 130 and the thermal expansion of the carrier substrate 110 is minor. Therefore, even if most of the flexible substrate 130 is in contact with the carrier substrate 110 through the opening 122a' of the frame adhesion structure 122a of the adhesion layer 120, the internal stress generated by the thermal expansion may not make the flexible substrate 130 be cracked or lifted up. On the other hand, because the difference between the thermal expansion coefficient of the flexible substrate 130 and the thermal expansion coefficient of the conductive layer and/or the insulation layer of the device layer 150 closest to the flexible substrate 130 is smaller than 10 ppm/° C., the difference between the thermal expansion of the flexible substrate 130 and the thermal expansion of the conductive layer and/or the insulation layer of the device layer 150 closest to the flexible substrate 130 is minor. Thus, even if the flexible substrate 130 is in contact with the device layer 150 directly, the internal stress generated by the thermal expansion may not make the flexible substrate 130 be cracked or lifted up. In this embodiment, the suitable manufacturing method would be selected according that the difference between the thermal expansion coefficients is smaller than 10 ppm/° C., so as to increase the yield rate of the flexible panel PN3 and save a manufacturing cost of the buffer layer 140.

Figure 18:
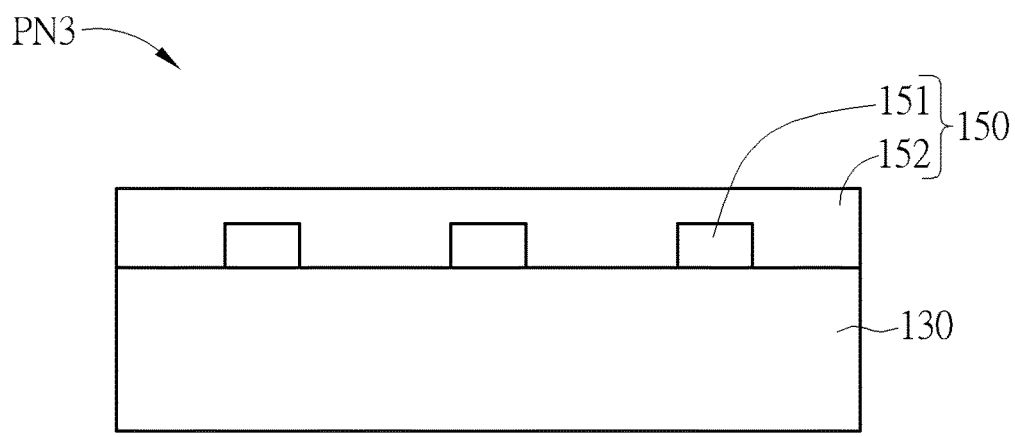
FIG. 18 is a schematic diagram of a cross-sectional view of the flexible panel according to the third embodiment of the present invention.
Figure 19:
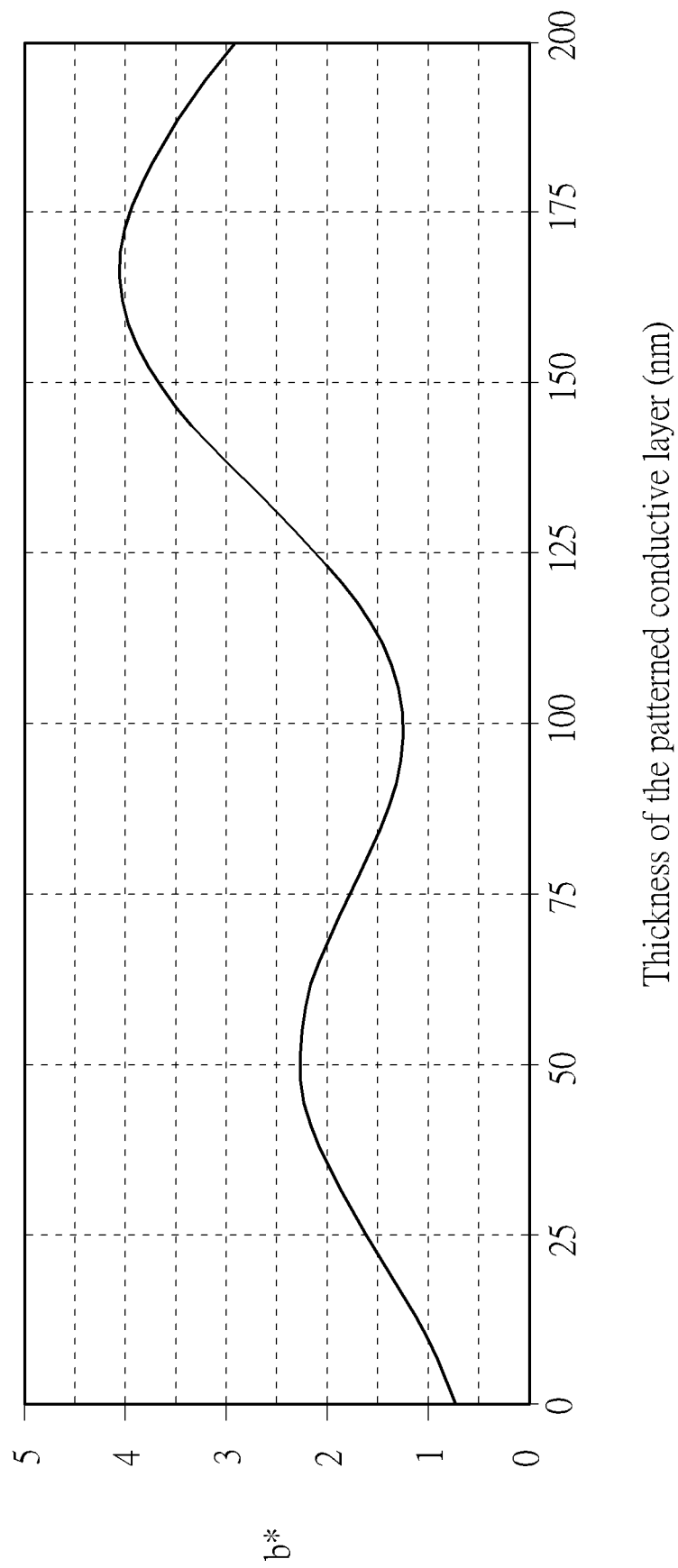
FIG. 19 is a schematic diagram of a relation between a thickness of the patterned conductive layer and b* of the flexible panel according to the third embodiment of the present invention.

Referring to FIG. 18 and FIG. 19, FIG. 18 is a schematic diagram of a cross-sectional view of the flexible panel according to the third embodiment of the present invention, FIG. 19 is a schematic diagram of a relation between a thickness of the patterned conductive layer and b* of the flexible panel according to the third embodiment of the present invention. As shown in FIG. 18, the flexible panel PN3 of this embodiment includes the flexible substrate 130 and the device layer 150, wherein the flexible panel PN3 is manufactured by the manufacturing method of the flexible panel of the third embodiment. The material of the flexible substrate 130 of this embodiment includes polyamide for example, but not limited thereto. The device layer 150 is disposed on the flexible substrate 130, and the device layer 150 may further include the touch electrodes or/and display electrodes, such that the device layer 150 may provide uses of touch sensing or/and display in the flexible panel PN3. In this embodiment, the material of the patterned conductive layer 151 may include indium tin oxide for example. The protective layer 152 is disposed on the patterned conductive layer 151, and the protective layer 152 may have a single-layer structure or a multi-layer structure, so as to encapsulate and protect the patterned conductive layer 151.

As shown in FIG. 19, when the thickness of the patterned conductive layer 151 is changed, b* of the flexible panel PN3 would be changed corresponding. Thus, in order to make b* of the flexible panel PN3 be smaller than or equal to 1.5, the thickness of the patterned conductive layer 151 is smaller than or equal to 20 nm or ranges from 90 nm to 110 nm.

To summarize, (1) when the difference between the thermal expansion coefficient of the flexible substrate 130 and the thermal expansion coefficient of the carrier substrate 110 is smaller than 10 ppm/° C. and the difference between the thermal expansion coefficient of the flexible substrate 130 and the thermal expansion coefficient of the conductive layer and/or the insulation layer of the device layer 150 closest to the flexible substrate 130 is smaller than 10 ppm/° C., the manufacturing method of the flexible panel of the embodiment shown in FIG. 16 (the third embodiment) may be used. That is, the flexible substrate 130 is in contact with the carrier substrate 110 and the device layer 150;

(2) when the difference between the thermal expansion coefficient of the flexible substrate 130 and the thermal expansion coefficient of the carrier substrate 110 is smaller than 10 ppm/° C. and the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C., the manufacturing method of the flexible panel of the embodiment shown in FIG. 2 (the first embodiment) may be used. That is, the flexible substrate 130 is in contact with the carrier substrate 110, and the buffer layer 140 is disposed between the flexible substrate 130 and the device layer 150;

(3) when the difference between the thermal expansion coefficient of the flexible substrate 130 and the thermal expansion coefficient of the carrier substrate 110 is greater than or equal to 10 ppm/° C. and the difference between the thermal expansion coefficient of the flexible substrate 130 and the thermal expansion coefficient of the conductive layer and/or the insulation layer of the device layer 150 closest to the flexible substrate 130 is smaller than 10 ppm/° C., the manufacturing method of the flexible panel of the embodiment shown in FIG. 2 (the first embodiment) or FIG. 14B (one type of the second embodiment) may be used. That is, the flexible substrate 130 is in contact with the carrier substrate 110 and the buffer layer 140 is disposed between the flexible substrate 130 and the device layer 150, or at least most of the flexible substrate 130 is not in contact with the carrier substrate 110 (as shown in FIG. 13A and FIG. 13B) and the flexible substrate 130 is in contact with the device layer 150;

(4) when the difference between the thermal expansion coefficient of the flexible substrate 130 and the thermal expansion coefficient of the carrier substrate 110 is greater than or equal to 10 ppm/° C. and the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C., the manufacturing method of the flexible panel of the embodiment shown in FIG. 2 (the first embodiment) or FIG. 14A (one type of the second embodiment) may be used. That is, the flexible substrate 130 is in contact with the carrier substrate 110 and the buffer layer 140 is disposed between the flexible substrate 130 and the device layer 150, or at least most of the flexible substrate 130 is not in contact with the carrier substrate 110 (as shown in FIG. 13A and FIG. 13B) and the buffer layer 140 is disposed between the flexible substrate 130 and the device layer 150.

According to the manufacturing method of the flexible panel of the first embodiment, the second embodiment and the third embodiment of the present invention, when the difference between the thermal expansion coefficient of the flexible substrate 130 and the thermal expansion coefficient of the conductive layer and/or the insulation layer of the device layer 150 closest to the flexible substrate 130 is greater than or equal to 10 ppm/° C., no matter what the difference between the thermal expansion coefficient of the flexible substrate 130 and the thermal expansion coefficient of the carrier substrate 110 is, the buffer layer 140 is formed on the flexible substrate 130 before forming the device layer 150, such that the buffer layer 140 is disposed between the flexible substrate 130 and the device layer 150.

Figure 20:
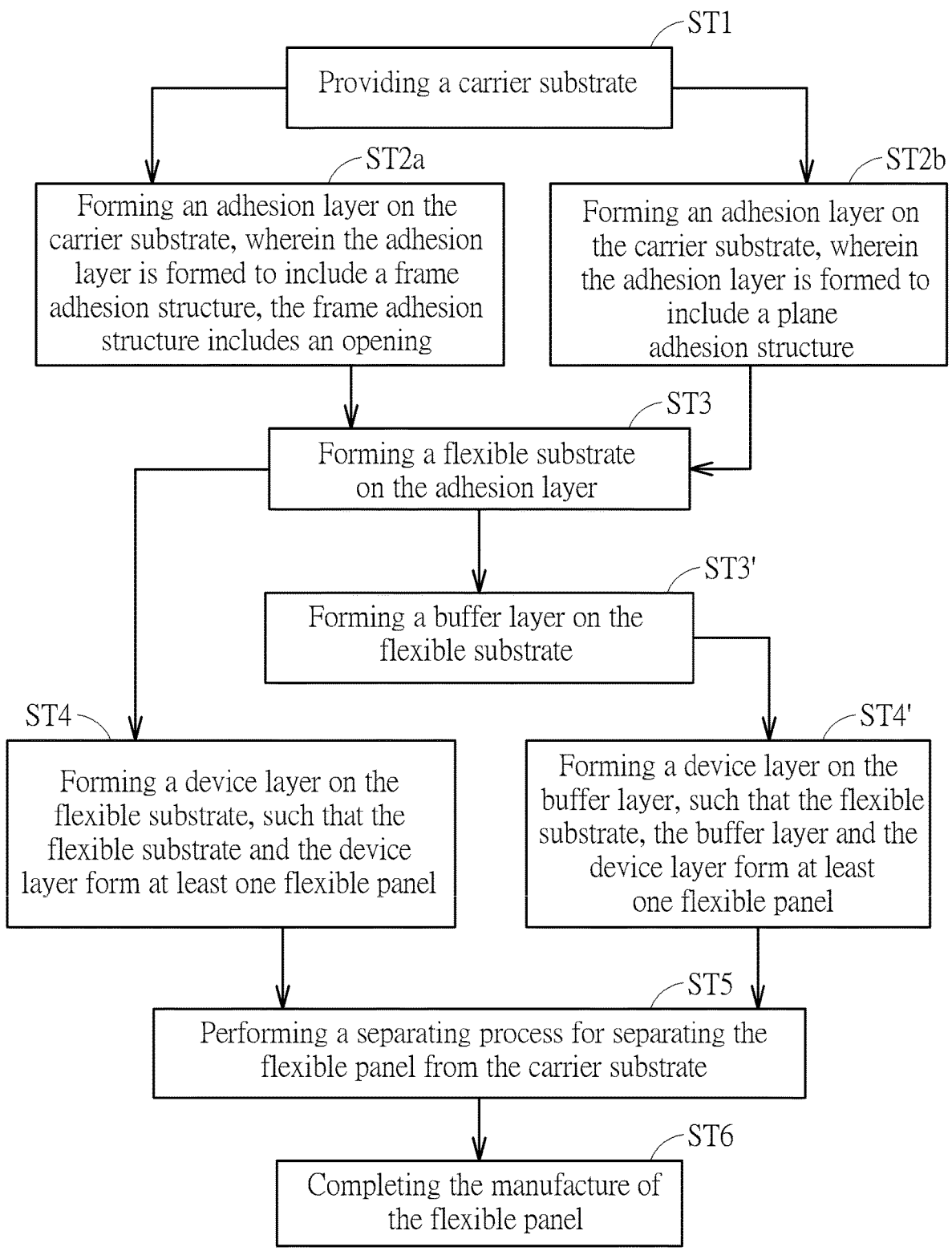
FIG. 20 is a flowchart of the manufacturing method of the flexible panel according to the present invention.

Referring to FIG. 20, FIG. 20 is a flowchart of the manufacturing method of the flexible panel according to the present invention. As shown in FIG. 20, the present invention provides a manufacturing method of the flexible panel. The manufacturing method includes following steps: providing a carrier substrate firstly (step ST1) ; forming an adhesion layer on the carrier substrate (steps ST2a, ST2b), then, forming a flexible substrate on the adhesion layer (step ST3), and next, forming a device layer on the flexible substrate, such that the flexible substrate and the device layer form at least one flexible panel (step ST4), or, forming an adhesion layer on the carrier substrate (steps ST2a, ST2b), then, forming a flexible substrate on the adhesion layer (step ST3), next, forming a buffer layer on the flexible substrate (step ST3'), and thereafter, forming a device layer on the buffer layer, such that the flexible substrate, the buffer layer and the device layer format least one flexible panel (step ST4'); performing a separating process for separating the flexible panel from the carrier substrate (step ST5) and completing the manufacture of the flexible panel (step ST6). Wherein, according to a relation between a thermal expansion coefficient of the flexible substrate and a thermal expansion coefficient of the carrier substrate, the manufacturing method of the flexible panel performs the manufacturing processes in a way selected from one of following manufacturing processes: when the difference between the thermal expansion coefficient of the flexible substrate and the thermal expansion coefficient of the carrier substrate is smaller than 10 ppm/° C., the adhesion layer is formed to include a frame adhesion structure, the frame adhesion structure includes an opening, and the flexible substrate is in contact with the frame adhesion structure and further in contact with the carrier substrate through the opening (step ST2a, that is the manufacturing method of the flexible panel of the first embodiment or the third embodiment of the present invention); when the difference between the thermal expansion coefficient of the flexible substrate and the thermal expansion coefficient of the carrier substrate is greater than or equal to 10 ppm/° C., one of following manner is selected to perform the manufacturing processes: the adhesion layer is formed to include a plane adhesion structure, and the flexible substrate is in contact with the adhesion layer (step ST2b, that is the manufacturing method of the flexible panel of the second embodiment of the present invention); or, the adhesion layer is formed to include the frame adhesion structure, the frame adhesion structure includes the opening, the flexible substrate is in contact with the frame adhesion structure and further in contact with the carrier substrate through the opening (step ST2a), and the buffer layer is formed on the flexible substrate before forming the device layer, such that the buffer layer is situated between the flexible substrate and the device layer (step ST3' and ST4', that is the manufacturing method of the flexible panel of the first embodiment of the present invention). In addition, when the difference between the thermal expansion coefficient of the flexible substrate and the thermal expansion coefficient of the conductive layer and/or the insulation layer of the device layer 150 closest to the flexible substrate 130 is greater than or equal to 10 ppm/° C., no matter what the difference between the thermal expansion coefficient of the flexible substrate and the thermal expansion coefficient of the carrier substrate is, the buffer layer is formed on the flexible substrate before forming the device layer, such that the buffer layer is situated between the flexible substrate and the device layer (step ST3' and ST4').

To summarize, the manufacturing method of the flexible panel of the present invention correspondingly selects the suitable manufacturing processes according to the relation of the thermal expansion coefficient of the carrier substrate, the thermal expansion coefficient of the flexible substrate and the thermal expansion coefficient of the conductive layer and/or the insulation layer of the device layer closest to the flexible substrate, so as to utilize the pattern of the adhesion layer and the disposition of the buffer layer for preventing the flexible substrate from being cracked or lifted up. Therefore, the yield rate can be increased and the manufacturing cost can be saved. On the other hand, in the correspondingly manufacturing flexible panel, the flexible panel having the buffer layer can utilize the buffer layer for serving as the index matching layer of the flexible panel, so as to adjust the color of the flexible panel, and the flexible panel which does not have the buffer layer can utilize changing the thickness of the patterned conductive layer for adjusting the color of the flexible panel, thereby improving the quality of display.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible panel, comprising:
   a flexible substrate, wherein a material of the flexible substrate comprises polyimide (PI), polyethylene terephthalate (PET), cyclic olefin polymer (COP), polycarbonate (PC), polymethyl methacrylate (PMMA), cyclic olefin copolymer (COC), triacetyl cellulose (TAC), polypropylene (PP), poly styrene (PS), glass, or a combination thereof;
   a buffer layer disposed on the flexible substrate, wherein the buffer layer comprises a first sub-buffer layer and a second sub-buffer layer, a lower surface and an upper surface of the second sub-buffer layer are in direct contact with the flexible substrate and a lower surface of the first sub-buffer layer, respectively, a refraction index of the second sub-buffer layer is different from a refraction index of the first sub-buffer layer, a material of the first sub-buffer layer comprises silicon oxide, and the refraction index of the second sub-buffer layer ranges from 2.05 to 2.25; and
   a device layer disposed on the buffer layer, wherein the device layer comprises a patterned conductive layer, and an upper surface of the first sub-buffer layer is in direct contact with a lower surface of the patterned conductive layer,
   wherein a thickness of the first sub-buffer layer and a thickness of the second sub-buffer layer satisfy one of following conditions (a) to (c), and the b* value in the CIE L*a*b* color space of the flexible panel is smaller than or equal to 1.5:
   (a) 55 nm≤the thickness of the second sub-buffer layer<65 nm, and the first sub-buffer layer and the second sub-buffer layer satisfy following condition: when (40+5Z) nm≤the thickness of the second sub-buffer layer<(40+5(Z+1)) nm, (U-5Z) nm≤the thickness of the first sub-buffer layer≤100 nm, wherein Z is an integer from 3 to 4, and U is 80;
   (b) 65 nm≤the thickness of the second sub-buffer layer<95 nm, and the first sub-buffer layer and the second sub-buffer layer satisfy following condition: when (65+5Z) nm≤the thickness of the second sub-buffer layer<(65+5(Z+1)) nm, (U-10Z) nm≤the thickness of the first sub-buffer layer≤100 nm, wherein Z is an integer from 0 to 5, U is 50 when Z is 0, and U is 55 when Z is the integer from 1 to 5; and
   (c) 95 nm≤the thickness of the second sub-buffer layer≤100 nm, and 0 nm<the thickness of the first sub-buffer layer≤100 nm.

2. The flexible panel according to claim 1, wherein the device layer comprises a touch electrode, a thin film transistor, a pixel electrode, an electrode, a light-emitting diode, a conductive line, an insulation layer, or a combination thereof.

3. The flexible panel according to claim 2, wherein the flexible panel is a flexible touch panel, a flexible display panel, or a flexible touch display panel.

4. The flexible panel according to claim 1, wherein a material of the second sub-buffer layer comprises niobium oxide.

5. A flexible panel, comprising:
   a flexible substrate, wherein a material of the flexible substrate comprises polyimide (PI), polyethylene terephthalate (PET), cyclic olefin polymer (COP), polycarbonate (PC), polymethyl methacrylate (PMMA), cyclic olefin copolymer (COC), triacetyl cellulose (TAC), polypropylene (PP), poly styrene (PS), glass, or a combination thereof;
   a buffer layer disposed on the flexible substrate, wherein the buffer layer comprises a first sub-buffer layer and a second sub-buffer layer, a lower surface and an upper surface of the second sub-buffer layer are in direct contact with the flexible substrate and a lower surface of the first sub-buffer layer, respectively, a refraction index of the second sub-buffer layer is different from a refraction index of the first sub-buffer layer, and a material of the first sub-buffer layer comprises silicon oxide; and
   a device layer disposed on the buffer layer, wherein the device layer comprises a patterned conductive layer, and an upper surface of the first sub-buffer layer is in direct contact with a lower surface of the patterned conductive layer, wherein the refraction index of the second sub-buffer layer ranges from 2.25 to 2.45, a thickness of the first sub-buffer layer and a thickness of the second sub-buffer layer satisfy one of following conditions (d) to (e), and the b* value in the CIE L*a*b* color space of the flexible panel is smaller than or equal to 1.5:

(d) 55 nm≤the thickness of the second sub-buffer layer<75 nm, and the first sub-buffer layer and the second sub-buffer layer satisfy following condition: when (55+5Z) nm≤the thickness of the second sub-buffer layer<(55+5(Z+1)) nm, (U−10Z) nm≤the thickness of the first sub-buffer layer≤100 nm, wherein Z is an integer from 0 to 3, and U is 60; and (e) 75 nm≤the thickness of the second sub-buffer layer≤100 nm, and the first sub-buffer layer and the second sub-buffer layer satisfy one of following conditions (e_1) to (e_3):

(e_1) when 75 nm≤the thickness of the second sub-buffer layer<80 nm, 15 nm ≤the thickness of the first sub-buffer layer≤100 nm;

(e_2) when 80 nm≤the thickness of the second sub-buffer layer≤95 nm, 0 nm <the thickness of the first sub-buffer layer≤100 nm; and (e_3) when 95 nm<the thickness of the second sub-buffer layer≤100 nm, 0 nm<the thickness of the first sub-buffer layer≤95 nm.

6. The flexible panel according to claim 5, wherein a material of the second sub-buffer layer comprises niobium oxide.

7. A manufacturing method of a flexible panel, comprising following manufacturing processes:

providing a carrier substrate;

forming an adhesion layer on the carrier substrate;

forming a flexible substrate on the adhesion layer, wherein a material of the flexible substrate comprises polyimide (PI), polyethylene terephthalate (PET), cyclic olefin polymer (COP), polycarbonate (PC), polymethyl methacrylate (PMMA), cyclic olefin copolymer (COC), triacetyl cellulose (TAC), polypropylene (PP), poly styrene (PS), glass, or a combination thereof;

forming a buffer layer on the flexible substrate, the buffer layer comprising a first sub-buffer layer and a second sub-buffer layer, and a refraction index of the second sub-buffer layer being different from a refraction index of the first sub-buffer layer, wherein a lower surface and an upper surface of the second sub-buffer layer are in direct contact with the flexible substrate and a lower surface of the first sub-buffer layer, respectively, a material of the first sub-buffer layer comprises silicon oxide, and the refraction index of the second sub-buffer layer ranges from 2.05 to 2.45, wherein a thickness of the first sub-buffer layer and a thickness of the second sub-buffer layer satisfy one of following conditions (a) to (c) when the refraction index of the second sub-buffer layer ranges from 2.05 to 2.25, the thickness of the first sub-buffer layer and the thickness of the second sub-buffer layer satisfy one of following conditions (d) to (e) when the refraction index of the second sub-buffer layer ranges from greater than 2.25 to 2.45, and the b* value in the CIE L*a*b* color space of the flexible panel is smaller than or equal to 1.5:

(a) 55 nm≤the thickness of the second sub-buffer layer<65 nm, and the first sub-buffer layer and the second sub-buffer layer satisfy following condition: when (40+5Z) nm≤the thickness of the second sub-buffer layer<(40+5(Z+1)) nm, (U−5Z) nm≤the thickness of the first sub-buffer layer≤100 nm, wherein Z is an integer from 3 to 4, and U is 80;

(b) 65 nm≤the thickness of the second sub-buffer layer<95 nm, and the first sub-buffer layer and the second sub-buffer layer satisfy following condition: when (65+5Z) nm≤the thickness of the second sub-buffer layer<(65+5(Z+1)) nm, (U−10Z) nm≤the thickness of the first sub-buffer layer≤100 nm, wherein Z is an integer from 0 to 5, U is 50 when Z is 0, and U is 55 when Z is the integer from 1 to 5; and (c) 95 nm≤the thickness of the second sub-buffer layer≤100 nm, and 0 nm<the thickness of the first sub-buffer layer≤100 nm.

(d) 55 nm≤the thickness of the second sub-buffer layer<75 nm, and the first sub-buffer layer and the second sub-buffer layer satisfy following condition: when (55+5Z) nm≤the thickness of the second sub-buffer layer<(55+5(Z+1)) nm, (U−10Z) nm≤the thickness of the first sub-buffer layer≤100 nm, wherein Z is an integer from 0 to 3, and U is 60; and (e) 75 nm≤the thickness of the second sub-buffer layer≤100 nm, and the first sub-buffer layer and the second sub-buffer layer satisfy one of following conditions (e_1) to (e_3):

(e_1) when 75 nm≤the thickness of the second sub-buffer layer<80 nm, 15 nm≤the thickness of the first sub-buffer layer≤100 nm;

(e_2) when 80 nm≤the thickness of the second sub-buffer layer≤95 nm, 0 nm<the thickness of the first sub-buffer layer≤100 nm; and (e_3) when 95 nm<the thickness of the second sub-buffer layer≤100 nm, 0 nm<the thickness of the first sub-buffer layer≤95 nm;

forming a device layer on the buffer layer, wherein the device layer comprises a patterned conductive layer, and an upper surface of the first sub-buffer layer is in direct contact with a lower surface of the patterned conductive layer; and performing a separating process for separating the flexible substrate, the buffer layer and the device layer from the carrier substrate.

8. The manufacturing method of a flexible panel according to claim 7, wherein the step of forming the buffer layer on the flexible substrate comprises disposing the second sub-buffer layer on the flexible substrate and disposing the first sub-buffer layer on the second sub-buffer layer.

9. The manufacturing method of a flexible panel according to claim 7, wherein the adhesion layer includes a frame adhesion structure having an opening, and the flexible substrate directly contacts the carrier substrate and the frame adhesion structure.

10. The manufacturing method of a flexible panel according to claim 9, wherein an adhesive force between the flexible substrate and the adhesion layer is greater than an adhesive force between the flexible substrate and the carrier substrate.

11. The manufacturing method of a flexible panel according to claim 9, wherein a difference between a thermal expansion coefficient of the flexible substrate and a thermal expansion coefficient of the carrier substrate is greater than or equal to 10 ppm/° C.

12. The manufacturing method of a flexible panel according to claim 9, wherein the device layer further includes at least one insulation layer, the difference between the thermal expansion coefficient of the flexible substrate and the thermal expansion coefficient of the carrier substrate is smaller than 10 ppm/° C., and the difference between the thermal expansion coefficient of the flexible substrate and the thermal expansion coefficient of at least one of the patterned conductive layer and the insulation layer of the device layer is greater than or equal to 10 ppm/° C.

13. The manufacturing method of a flexible panel according to claim 7, wherein the adhesion layer includes a mesh-shape adhesion structure having multiple openings, and the flexible substrate directly contacts the carrier substrate and the mesh-shape adhesion structure.

14. The manufacturing method of a flexible panel according to claim 7, wherein the adhesion layer includes a plane adhesion structure, and the whole flexible substrate is disposed on the adhesion layer and directly contact the adhesion layer.

15. The manufacturing method of a flexible panel according to claim 14, wherein the device layer further includes at least one insulation layer, the difference between the thermal expansion coefficient of the flexible substrate and the thermal expansion coefficient of the carrier substrate is greater than or equal to 10 ppm/° C., and the difference between the thermal expansion coefficient of the flexible substrate and the thermal expansion coefficient of at least one of the patterned conductive layer and the insulation layer of the device layer closest to the flexible substrate is greater than or equal to 10 ppm/° C.

16. The manufacturing method of a flexible panel according to claim 7, wherein the adhesion layer includes a plane adhesion structure, the flexible substrate directly contacts the adhesion layer and directly contacts the carrier substrate along the edges of the adhesion layer.

\* \* \* \* \*